US012750031B2

(12) United States Patent
Suzuki

(10) Patent No.: US 12,750,031 B2
(45) Date of Patent: Sep. 29, 2026

(54) ACOUSTIC WAVE DEVICE

(71) Applicant: Murata Manufacturing Co., Ltd., Nagaokakyo (JP)

(72) Inventor: Katsumi Suzuki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 722 days.

(21) Appl. No.: 18/208,918

(22) Filed: Jun. 13, 2023

(65) Prior Publication Data

US 2023/0327638 A1 Oct. 12, 2023

Related U.S. Application Data

(63) Continuation of application No. PCT/JP2021/045846, filed on Dec. 13, 2021.
(Continued)

(51) Int. Cl.
*H03H 9/02* (2006.01)
*H03H 3/02* (2006.01)
*H03H 9/205* (2006.01)

(52) U.S. Cl.
CPC .......... *H03H 9/02228* (2013.01); *H03H 3/02* (2013.01); *H03H 9/02015* (2013.01);
(Continued)

(58) Field of Classification Search
CPC .. H03H 9/02228; H03H 9/02; H03H 9/02015; H03H 9/205; H03H 9/02062; H03H 9/02086; H03H 9/02102; H03H 9/1042; H03H 9/174; H03H 3/02; H03H 2003/023
See application file for complete search history.

(56) References Cited

U.S. PATENT DOCUMENTS

2011/0284995 A1* 11/2011 Kuypers .................. B81B 7/02
438/770
2013/0057360 A1 3/2013 Meltaus et al.
(Continued)

FOREIGN PATENT DOCUMENTS

CN 106716827 A 5/2017
JP 2013528996 A 7/2013
(Continued)

OTHER PUBLICATIONS

International Search Report in PCT/JP2021/045846, mailed Jan. 25, 2022, 4 pages.
(Continued)

*Primary Examiner* — Emily P Pham
(74) *Attorney, Agent, or Firm* — Keating & Bennett, LLP

(57) ABSTRACT

An acoustic wave device includes a support including support substrate and an intermediate layer on the support substrate, a piezoelectric layer on the intermediate layer, and an IDT electrode on the piezoelectric layer. A cavity portion is provided in the support. The piezoelectric layer includes a membrane portion overlapping the cavity portion in a plan view. At least a portion of the IDT electrode is in the membrane portion. A spacer layer is in the support and made of a material different from materials of the piezoelectric layer and the intermediate layer. The spacer layer is located in a portion other than the cavity portion.

21 Claims, 18 Drawing Sheets

Related U.S. Application Data

(60) Provisional application No. 63/124,966, filed on Dec. 14, 2020.

(52) U.S. Cl.
CPC ........ *H03H 9/02157* (2013.01); *H03H 9/205* (2013.01); *H03H 2003/023* (2013.01)

(56) References Cited

U.S. PATENT DOCUMENTS

| | | | |
|---|---|---|---|
| 2014/0152145 A1 | 6/2014 | Kando et al. | |
| 2017/0194933 A1 | 7/2017 | Kishimoto et al. | |
| 2017/0358730 A1 | 12/2017 | Kishimoto et al. | |
| 2019/0273478 A1 | 9/2019 | Lin et al. | |
| 2021/0408994 A1* | 12/2021 | Nagatomo | H03H 9/02228 |

FOREIGN PATENT DOCUMENTS

| | | |
|---|---|---|
| JP | 2017224890 A | 12/2017 |
| JP | 2018125792 A | 8/2018 |
| JP | 2019154031 A | 9/2019 |
| WO | 2012073871 A1 | 6/2012 |
| WO | 2016068003 A1 | 5/2016 |

OTHER PUBLICATIONS

Written Opinion in PCT/JP2021/045846, mailed Jan. 25, 2022, 4 pages.

Official Communication issued in corresponding Chinese Patent Application No. 202180083599.8, mailed on May 28, 2026, 8 pages.

* cited by examiner

ACOUSTIC WAVE DEVICE

CROSS REFERENCE TO RELATED APPLICATIONS

This application claims the benefit of priority to Provisional Application No. 63/124,966 filed on Dec. 14, 2020 and is a Continuation Application of PCT Application No. PCT/JP2021/045846 filed on Dec. 13, 2021. The entire contents of each application are hereby incorporated herein by reference.

BACKGROUND OF THE INVENTION

1. Field of the Invention

The present invention relates to an acoustic wave device.

2. Description of the Related Art

Existing acoustic wave devices have been widely used in filters of mobile phones and the like. Japanese Unexamined Patent Application Publication No. 2017-224890 discloses an example of an acoustic wave device. In this acoustic wave device, a support layer is provided on a support substrate. A piezoelectric thin film is provided on the support layer. An interdigital transducer (IDT) electrode is provided on the piezoelectric thin film. The support layer is provided with a recess. The recess is covered with the piezoelectric thin film. Thus, a hollow space is formed. The hollow space is formed by removing a sacrificial layer provided in the support layer.

Note that in manufacturing the acoustic wave device described in Japanese Unexamined Patent Application Publication No. 2017-224890, after the sacrificial layer is formed on the piezoelectric substrate, the support layer is provided so as to cover the sacrificial layer. Thereafter, the support layer is flattened. The support substrate is bonded to the flattened surface of the support layer. The thickness of the above piezoelectric substrate is reduced to form the piezoelectric thin film. An etching hole is provided in the piezoelectric thin film. The sacrificial layer is removed from the etching hole.

SUMMARY OF THE INVENTION

However, even when the support layer is flattened as described in Japanese Unexamined Patent Application Publication No. 2017-224890, undulation may occur on the surface of the support layer. When the support substrate having high rigidity is bonded to this surface, the surface of the support layer on the piezoelectric substrate side tends to undulate due to the influence of the above-described undulation. Therefore, when the piezoelectric thin film is used to form the piezoelectric substrate, the thickness of the piezoelectric thin film may vary. When the variation in the thickness of the piezoelectric thin film is large, an unnecessary wave may be generated and the frequency characteristics of the acoustic wave device may deteriorate.

Preferred embodiments of the present invention provide acoustic wave devices each capable of reducing or preventing variation in the thickness of a piezoelectric layer and reducing or preventing deterioration of frequency characteristics.

An acoustic wave device according to a preferred embodiment of the present invention includes a support including a support substrate and an intermediate layer on the support substrate, a piezoelectric layer on the intermediate layer, and an excitation electrode on the piezoelectric layer, in which a cavity portion is provided in the support, the piezoelectric layer includes a membrane portion overlapping the cavity portion in a plan view, the membrane portion including at least a portion of the excitation electrode, a spacer layer is provided in the support and made of a material different from materials of the piezoelectric layer and the intermediate layer, and the spacer layer is located in a portion other than the cavity portion.

According to the acoustic wave devices according to preferred embodiments of the present invention, it is possible to reduce or prevent variation in the thickness of the piezoelectric layer and to reduce or prevent deterioration of frequency characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention will be described with reference to the drawings to clarify the present invention.

Note that the preferred embodiments described in the present specification each are merely examples, and partial replacement or combination of configurations is possible between different preferred embodiments.

Figure 1:
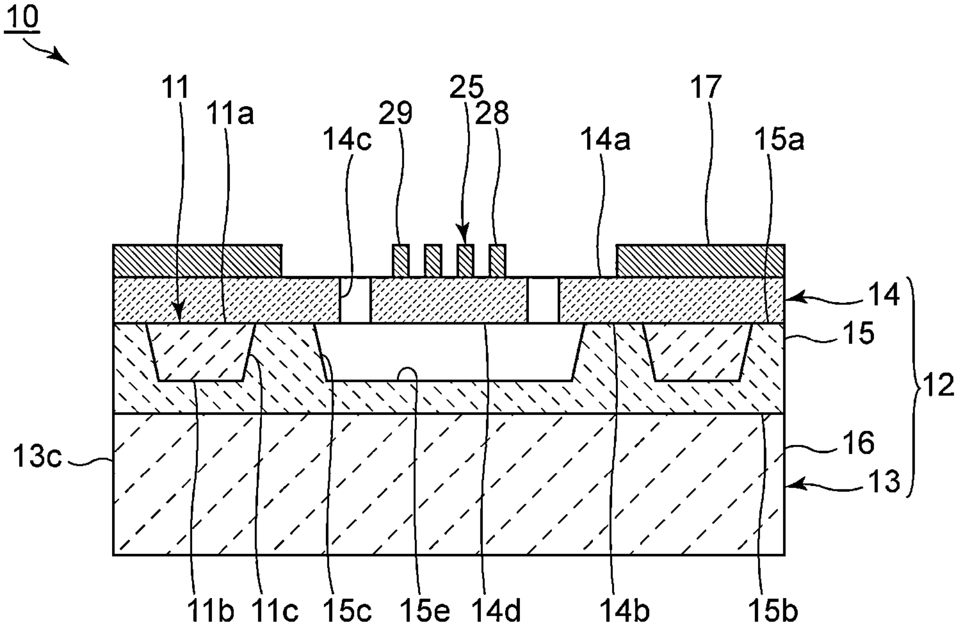
FIG. 1 is a front cross-sectional view of an acoustic wave device according to a first preferred embodiment of the present invention.

FIG. 1 is a front cross-sectional view of an acoustic wave device according to a first preferred embodiment of the present invention.

An acoustic wave device 10 includes a piezoelectric substrate 12 and an IDT electrode 25. The piezoelectric substrate 12 includes a support member 13 and a piezoelectric layer 14. In the present preferred embodiment, the support member 13 includes a support substrate 16 and an intermediate layer 15. The intermediate layer 15 is provided on the support substrate 16. The piezoelectric layer 14 is provided on the intermediate layer 15.

The piezoelectric layer 14 includes a first main surface 14*a* and a second main surface 14*b*. The first main surface 14*a* and the second main surface 14*b* face each other. Of the first main surface 14*a* and the second main surface 14*b*, the second main surface 14*b* is a main surface on the support member 13 side. As the material for the piezoelectric layer 14, for example, lithium niobate, lithium tantalate, or the like can be used.

The intermediate layer 15 includes a third main surface 15*a* and a fourth main surface 15*b*. The third main surface 15*a* and the fourth main surface 15*b* face each other. The third main surface 15*a* is a main surface on the piezoelectric layer 14 side. The fourth main surface 15*b* is a main surface on the support substrate 16 side. A recess 15*c* is provided on the third main surface 15*a* side of the intermediate layer 15. The recess 15*c* includes a bottom surface 15*e*. The piezoelectric layer 14 is provided on the intermediate layer 15 so as to close the recess 15*c*. Thus, a cavity portion is formed. The cavity portion is surrounded by the recess 15*c* of the intermediate layer 15 and the piezoelectric layer 14.

As the material for the intermediate layer 15, for example, silicon oxide, tantalum oxide, or the like can be used. As the material for the support substrate, piezoelectric bodies such as aluminum oxide, lithium tantalate, lithium niobate, quartz and the like; various types of ceramics such as alumina, sapphire, magnesia, silicon nitride, aluminum nitride, silicon carbide, zirconia, cordierite, mullite, steatite, forsterite and the like; dielectrics such as diamond and glass; semiconductors such as silicon, gallium nitride and the like; or resin and the like can be used.

The piezoelectric layer 14 includes a membrane portion 14*d*. The membrane portion 14*d* is a portion of the piezoelectric layer 14 that overlaps the cavity portion in a plan view. In this specification, a plan view refers to a view from a direction corresponding to an upper side in FIG. 1. The membrane portion 14*d* is provided with a plurality of through-holes 14*c*. The through-hole 14*c* is used for removing a sacrificial layer in a manufacturing process. At least one through-hole 14*c* may be provided.

The IDT electrode 25 as an excitation electrode is provided on the first main surface 14*a* of the piezoelectric layer 14. At least a portion of the IDT electrode 25 is provided on the membrane portion 14*d* of the piezoelectric layer 14. In other words, at least a portion of the IDT electrode 25 overlaps the cavity portion in a plan view. Further, a wiring 17 is provided on the first main surface 14*a*. The wiring 17 is electrically connected to the IDT electrode 25.

The acoustic wave device 10 of the present preferred embodiment is an acoustic wave resonator. However, an acoustic wave device according to a preferred embodiment of the present invention may be a filter device or a multiplexer including a plurality of acoustic wave resonators. Alternatively, an acoustic wave device according to a preferred embodiment of the present invention may include a plurality of acoustic wave resonators and may define a portion of a filter device.

As illustrated in FIG. 1, a spacer layer 11 is provided in the intermediate layer 15. More specifically, the spacer layer 11 is provided in a region of the intermediate layer 15 that does not overlap the cavity portion in a plan view. The spacer layer 11 includes a first surface 11*a*, a second surface 11*b*, and a side surface 11*c*. The first surface 11*a* and the second surface 11*b* face each other in a laminating direction of the support member 13. The first surface 11*a* is a surface on the piezoelectric layer 14 side. The second surface 11*b* is a surface on the support substrate 16 side. The side surface 11*c* is connected to the first surface 11*a* and the second surface 11*b*. Hereinafter, the laminating direction of the support member 13 is simply referred to as a laminating direction.

In the present preferred embodiment, the first surface 11*a* of the spacer layer 11 is in contact with the piezoelectric layer 14. The first surface 11*a* is flush with a surface of the intermediate layer 15 that is in contact with the piezoelectric layer 14. The second surface 11*b* is located in the intermediate layer 15. The side surface 11*c* is inclined with respect to the laminating direction. However, the side surface 11*c* may extend parallel or substantially parallel to the laminating direction.

Figure 2:
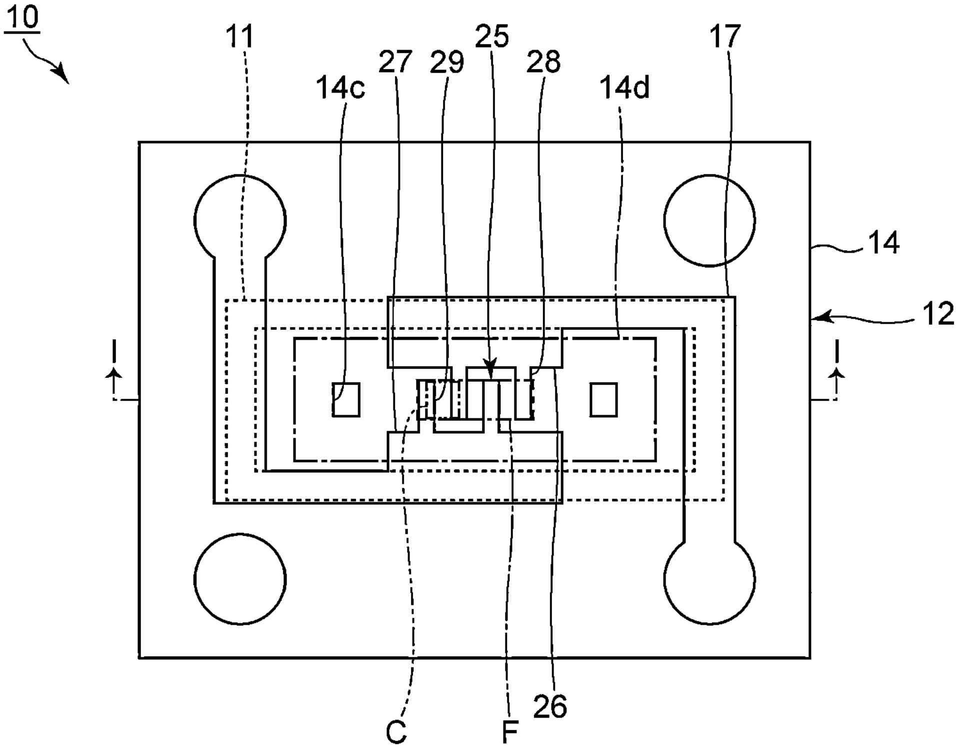
FIG. 2 is a plan view of the acoustic wave device according to the first preferred embodiment of the present invention.

FIG. 2 is a plan view of the acoustic wave device according to the first preferred embodiment. Note that the above FIG. 1 is a cross-sectional view taken along a line I-I in FIG. 2.

The spacer layer 11 is provided so as to surround the membrane portion 14*d* of the piezoelectric layer 14 in a plan view. The spacer layer 11 has a frame shape. However, the position and shape of the spacer layer 11 are not limited to those described above. The spacer layer 11 may be made of, for example, an appropriate metal or appropriate ceramics.

The present preferred embodiment is characterized in that the spacer layer 11 is provided in the support member 13, the material of the spacer layer 11 is different from the materials of the piezoelectric layer 14 and the intermediate layer 15, and the spacer layer 11 is arranged in a portion other than the cavity portion. As such, variation in the thickness of the piezoelectric layer 14 can be reduced. As a result, it is possible to reduce or prevent unnecessary bulk waves caused by the variation in the thickness of the piezoelectric layer 14. Therefore, it is possible to reduce or prevent deterioration of the frequency characteristics of the acoustic wave device 10. This will be described in detail below by comparing an example of a method for manufacturing the acoustic wave device 10 of the present preferred embodiment with a manufacturing method of a comparative example.

FIGS. 3A to 3D are front cross-sectional views for describing a sacrificial layer/spacer layer forming process, an intermediate layer forming process, and a support substrate bonding process in the example of the method for manufacturing the acoustic wave device according to the first preferred embodiment. FIGS. 4A to 4C are front cross-sectional views for describing a piezoelectric layer grinding process, an electrode forming process, a through-hole forming process, and a sacrificial layer removing process in the example of the method for manufacturing the acoustic wave device according to the first preferred embodiment.

Figure 3A:
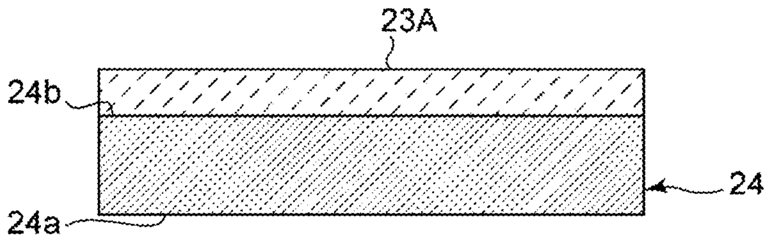
FIGS. 3A to 3D are front cross-sectional views for describing a sacrificial layer/spacer layer forming process, an intermediate layer forming process, and a support substrate bonding process in an example of a method for manufacturing the acoustic wave device according to the first preferred embodiment of the present invention.
Figure 4A:
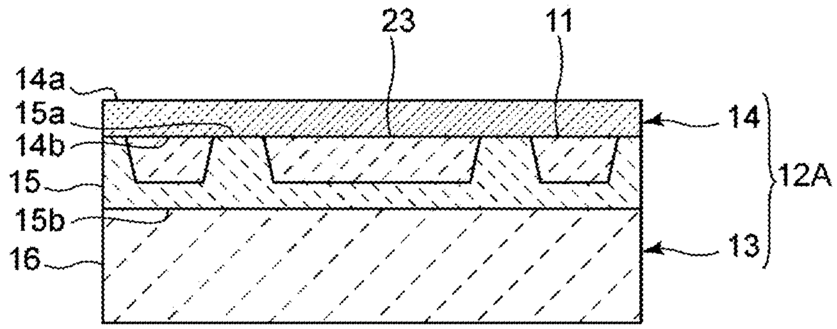
FIGS. 4A to 4C are front cross-sectional views for describing a piezoelectric layer grinding process, an electrode forming process, a through-hole forming process, and a sacrificial layer removing process in the example of the method for manufacturing the acoustic wave device according to the first preferred embodiment of the present invention.
Figure 4B:
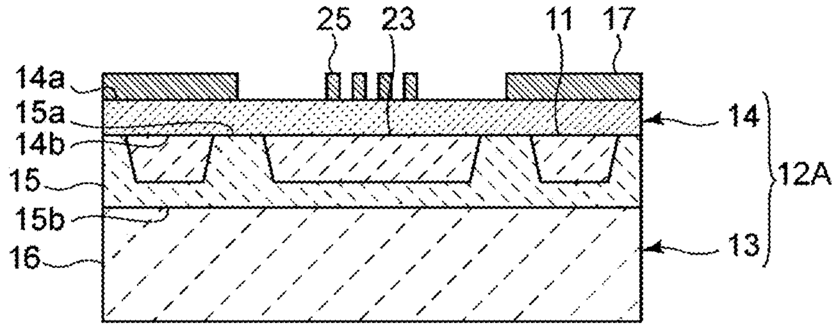
Figure 4C:
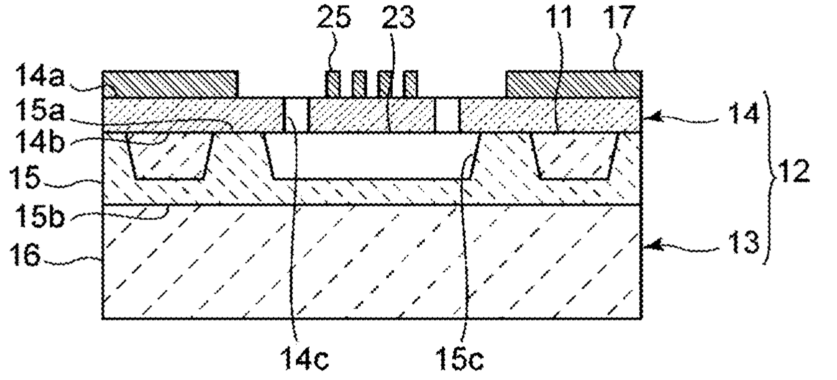

As illustrated in FIG. 3A, a piezoelectric substrate 24 is prepared. Note that the piezoelectric substrate 24 is included in the piezoelectric layer in a preferred embodiment of the present invention. The piezoelectric substrate 24 includes a first main surface 24*a* and a second main surface 24*b*. The first main surface 24*a* and the second main surface 24*b* face each other. A sacrificial layer 23A is formed on the second main surface 24*b*. As the material for the sacrificial layer 23A, for example, ZnO, Si, $SiO_2$, Cu, or resin can be used.

Figure 3B:
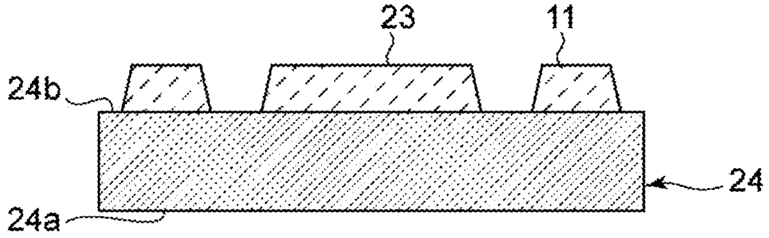

Next, the sacrificial layer 23A is patterned by, for example, etching. At this time, an appropriate resist pattern may be formed by, for example, a photolithography method and the like. After that, etching may be performed. Note that after patterning, the resist pattern is peeled off. Thus, as illustrated in FIG. 3B, a sacrificial layer 23 and the spacer layer 11 are obtained at the same time. The sacrificial layer 23 and the spacer layer 11 are made of the same material.

However, the sacrificial layer 23 and the spacer layer 11 may be made of different materials from each other. In this case, after one of the sacrificial layer 23 and the spacer layer 11 is formed, the other of the sacrificial layer 23 and the spacer layer 11 may be formed.

In this example of the manufacturing method, the spacer layer 11 is provided so as to surround the sacrificial layer 23 in a plan view. The height of each of the sacrificial layer 23 and the spacer layer 11 is a dimension of each of the sacrificial layer 23 and the spacer layer 11 along the laminating direction. In the present specification, "the sacrificial layer 23 and the spacer layer 11 have the same height" includes a case where the difference in height between the sacrificial layer 23 and the spacer layer 11 is within about 10% of the height of the sacrificial layer 23.

Figure 3C:
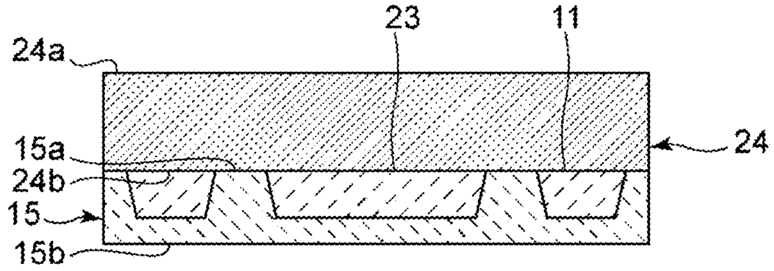

Next, as illustrated in FIG. 3C, the intermediate layer 15 is formed on the second main surface 24*b* of the piezoelectric substrate 24 so as to cover the sacrificial layer 23 and the spacer layer 11. The intermediate layer 15 can be formed by, for example, a sputtering method, a vacuum deposition method, or the like. Next, the intermediate layer 15 is flattened. When flattening the intermediate layer 15, for example, grinding, chemical mechanical polishing (CMP), or the like may be used.

Figure 3D:
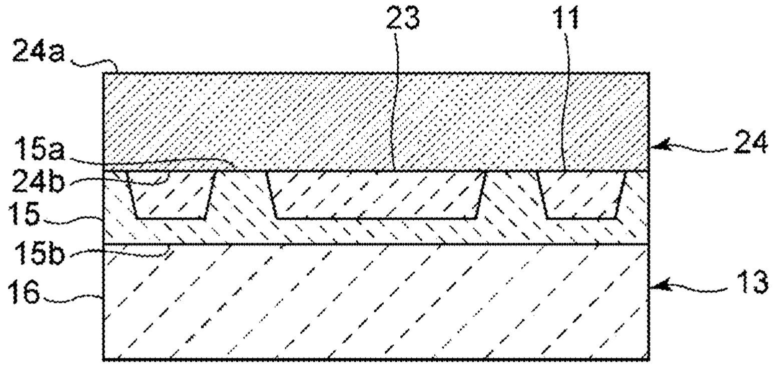

Next, as illustrated in FIG. 3D, the support substrate 16 is bonded to the fourth main surface 15*b* of the intermediate layer 15. Next, the thickness of the piezoelectric substrate 24 is adjusted. To be more specific, the thickness of the piezoelectric substrate 24 is thinned by grinding or polishing the first main surface 24*a* side of the piezoelectric substrate 24. For example, grinding, the CMP method, an ion slicing method, etching, or the like can be used for adjusting the thickness of the piezoelectric substrate 24. As such, as illustrated in FIG. 4A, the piezoelectric layer 14 is obtained. Thus, a laminated body 12A of the support member 13 and the piezoelectric layer 14 is obtained. Note that in the laminated body 12A, the sacrificial layer 23 and the spacer layer 11 are embedded in the support member 13.

Next, as illustrated in FIG. 4B, the IDT electrode 25 and the wiring 17 are provided on the first main surface 14*a* of the piezoelectric layer 14. At this time, the IDT electrode 25 is formed such that at least a portion of the IDT electrode 25 and the sacrificial layer 23 overlap each other in a plan view. The IDT electrode 25 and the wiring 17 can be provided by, for example, a sputtering method, a vacuum evaporation method, or the like.

Next, the through-hole 14*c* illustrated in FIG. 4C is provided in the piezoelectric layer 14 so as to reach the sacrificial layer 23. The through-hole 14*c* can be formed by, for example, a reactive ion etching (RIE) method or the like. Next, the sacrificial layer 23 is removed via the through-hole 14*c*. To be more specific, the sacrificial layer 23 in the recess 15*c* of the intermediate layer 15 is removed by allowing an etching liquid or a plasma gas to flow from the through-hole 14*c*. Thus, a cavity portion is formed. As described above, the acoustic wave device 10 is obtained.

Figure 5A:
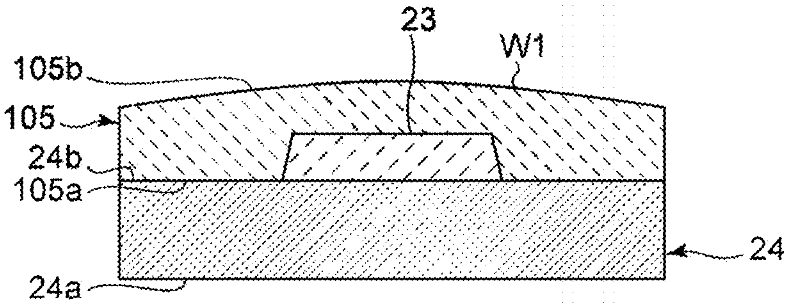
FIGS. 5A and 5B are front cross-sectional views illustrating a manufacturing method of a comparative example.
Figure 5B:
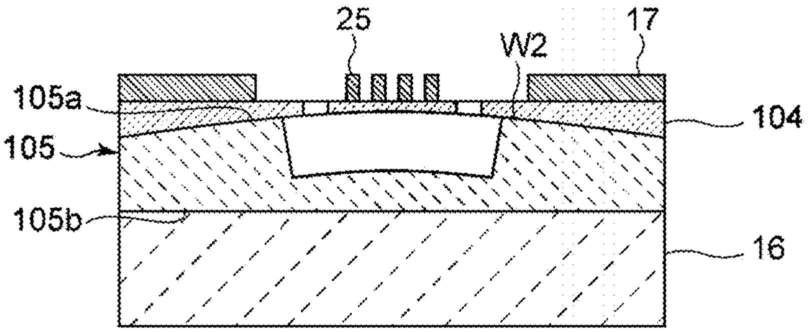

FIGS. 5A and 5B are front cross-sectional views illustrating a manufacturing method of a comparative example.

As illustrated in FIG. 5A, in the comparative example, an intermediate layer 105 is flattened in a state where the spacer layer 11 is not provided. In this case, as schematically illustrated in FIG. 5A, an undulation W1 is likely to occur on a fourth main surface 105*b* of the intermediate layer 105. As illustrated in FIG. 5B, when the support substrate 16 is bonded to the fourth main surface 105*b* of the intermediate layer 105, an undulation W2 caused by the undulation W1 is likely to occur on a third main surface 105*a* side. Therefore, when a piezoelectric layer 104 is formed from the piezoelectric substrate 24, the thickness of the piezoelectric layer 104 is likely to vary due to the influence of the undulation W2.

Figure 6:
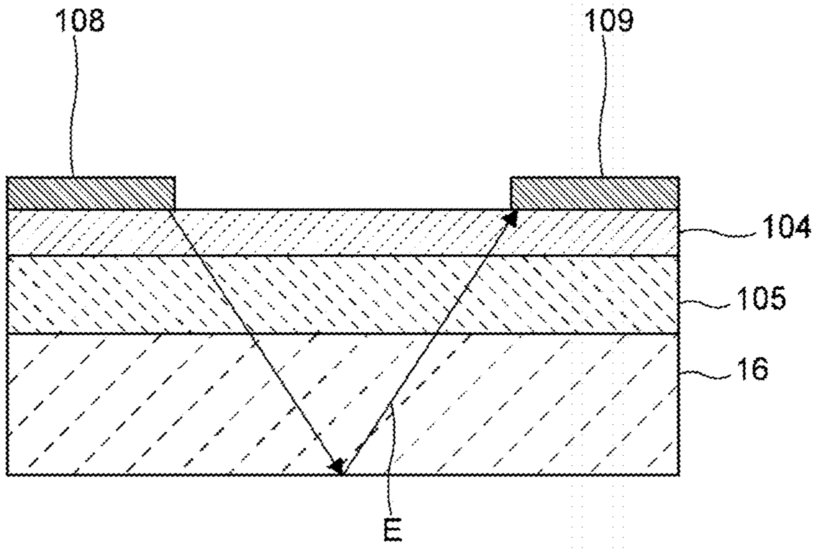
FIG. 6 is a front cross-sectional view illustrating the vicinity of wiring of a filter device for explaining unnecessary bulk waves.

When the variation in the thickness of the piezoelectric layer 104 is large, an unnecessary bulk wave is likely to be generated in a thickness direction of the piezoelectric layer 104. More specifically, for example, an unnecessary bulk wave is likely to be generated in a portion where the wiring is provided on the piezoelectric layer 104. As schematically illustrated in FIG. 6, for example, an unnecessary bulk wave E generated in a wiring 108 at a hot potential may be reflected on the support substrate 16 side and reach a wiring 109 at the ground potential. In this case, ripples occur in the frequency characteristics.

Figure 7:
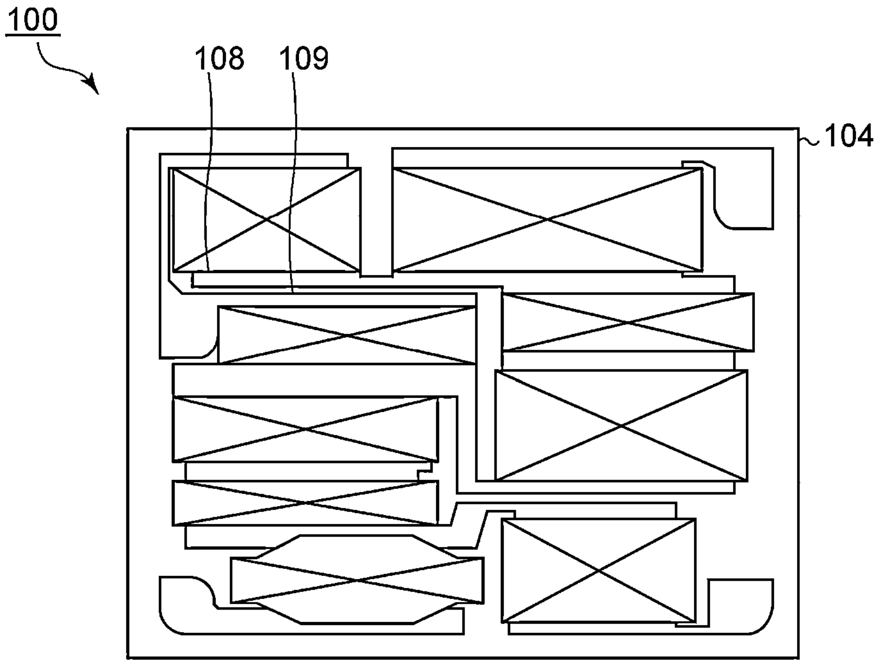
FIG. 7 is a schematic plan view of the filter device for explaining unnecessary bulk waves.

Note that the wiring 108 and the wiring 109 described above are, for example, wirings in a filter device 100 as illustrated in FIG. 7. In FIG. 7, each resonator is illustrated by a diagram of a rectangle with two diagonals. In the example illustrated in FIG. 7, the wiring 108 and the wiring 109 face each other and are connected to different resonators. The ripples caused by unnecessary bulk waves may also occur within the pass band of the filter device 100.

On the other hand, in the present preferred embodiment, as illustrated in FIG. 3C, the spacer layer 11 is provided in the intermediate layer 15. Therefore, when flattening the intermediate layer 15, it is possible to make the state of the portion where the sacrificial layer 23 is provided and the state of the portion where the sacrificial layer 23 is not provided close to each other. As a result, undulation of the intermediate layer 15 at the fourth main surface 15*b* is reduced or prevented. As a result, as illustrated in FIG. 3D, even when the support substrate 16 is bonded to the fourth main surface 15*b*, undulation caused by the undulation of the fourth main surface 15*b* is less likely to occur on the third main surface 15*a* side. In this manner, the piezoelectric substrate 24 is ground or polished in a state in which the undulation on the third main surface 15*a* side is suppressed. As such, as illustrated in FIG. 4A, it is possible to reduce or prevent variation in the thickness of the piezoelectric layer 14. Therefore, it is possible to reduce or prevent an unnecessary bulk wave caused by the variation in the thickness of the piezoelectric layer 14, and it is possible to reduce or prevent deterioration of frequency characteristics.

In the following, further details of the configuration of the present preferred embodiment and preferred configurations will be described.

As illustrated in FIG. 2, in the present preferred embodiment, the excitation electrode is the IDT electrode 25. The IDT electrode 25 includes a first busbar 26, a second busbar 27, a plurality of first electrode fingers 28, and a plurality of second electrode fingers 29. The first electrode finger 28 is a first electrode. The plurality of first electrode fingers 28 is periodically arranged. One ends of the plurality of first electrode fingers 28 each are connected to the first busbar 26. The second electrode finger 29 is a second electrode. The plurality of second electrode fingers 29 is periodically arranged. One ends of the plurality of second electrode fingers 29 each are connected to the second busbar 27. The plurality of first electrode fingers 28 and the plurality of second electrode fingers 29 are interdigitated with each other.

The first busbar 26 and the second busbar 27 are connected to potentials different from each other. Therefore, the first electrode fingers 28 and the second electrode fingers 29 are also connected to potentials different from each other. More specifically, in the present preferred embodiment, the first busbar 26 and the first electrode fingers 28 are connected to the ground potential. The second busbar 27 and the second electrode fingers 29 are connected to the hot potential. However, the potentials to which the first electrode fingers 28 and the second electrode fingers 29 are connected are not limited to those described above. The IDT electrode 25 may include a single-layer metal film or a laminated metal film.

Note that hereinafter, the first electrode fingers 28 and the second electrode fingers 29 may be simply referred to as electrode fingers. When a direction in which adjacent electrode fingers face each other is referred to as an electrode finger facing direction and a direction in which a plurality of electrode fingers extends is referred to as an electrode finger extending direction, in the present preferred embodiment, the electrode finger extending direction is perpendicular or substantially perpendicular to the electrode finger facing direction.

In the IDT electrode 25, a region in which adjacent electrode fingers overlap each other when viewed from the electrode finger facing direction is an overlap region F. The overlap region F is a region including an electrode finger at one end to an electrode finger at the other end in the electrode finger facing direction of the IDT electrode 25. More specifically, the overlap region F includes from an outer end edge portion of the electrode finger at the above one end in the electrode finger facing direction to an outer end edge portion of the electrode finger at the above other end in the electrode finger facing direction. Furthermore, the acoustic wave device 10 includes a plurality of excitation regions C. Similar to the overlap region F, the excitation region C is a region where adjacent electrode fingers overlap each other when viewed from the electrode finger facing direction. Each excitation region C is a region between a pair of electrode fingers. More specifically, the excitation region C is a region from the center of one electrode finger in the electrode finger facing direction to the center of the other electrode finger in the electrode finger facing direction. Therefore, the overlap region F includes the plurality of excitation regions C.

When an AC voltage is applied to the IDT electrode 25, acoustic waves are excited in the plurality of excitation regions C. In the present preferred embodiment, the acoustic wave device 10 is configured to be able to use bulk waves in the thickness-shear mode such as a first order thickness-shear mode. Note that the acoustic wave device 10 may be configured to be able to use plate waves. When the acoustic wave device 10 uses plate waves, the overlap region F is the excitation region.

When bulk waves in the thickness-shear mode is used as in the present preferred embodiment, the piezoelectric layer 14 is preferably made of lithium niobate such as $LiNbO_3$ or lithium tantalate such as a $LiTaO_3$ layer. In the present specification, a case where a certain member is made of a certain material includes a case where a trace amount of impurities is included to such an extent that electrical characteristics of the acoustic wave device are not deteriorated. Note that when the plate wave is used, the material of the piezoelectric layer 14 is not limited to lithium niobate or lithium tantalate, but may be zinc oxide, aluminum nitride, crystal, lead zirconate titanate (PZT), or the like.

As illustrated in FIG. 1, the position of the second surface lib of the spacer layer 11 in the laminating direction is the same as the position of the bottom surface 15*e* of the recess 15*c* of the intermediate layer 15 in the laminating direction. Here, a distance from the surface of the intermediate layer 15 on the support substrate 16 side to the bottom surface 15*e* is defined as L1, and a distance from the surface of the intermediate layer 15 on the support substrate 16 side to the second surface 11*b* is defined as L2. The case where the position of the second surface 11*b* and the position of the bottom surface 15*e* are the same includes the case where L2 is within a range of L1±about 10%.

As in the present preferred embodiment, the position of the second surface 11*b* of the spacer layer 11 in the laminating direction is preferably the same as the position of the bottom surface 15*e* of the recess 15*c* of the intermediate layer 15 in the laminating direction. More specifically, L2 is more preferably within a range of L1±about 5%. As such, it is possible to effectively reduce or prevent the variation in the thickness of the piezoelectric layer 14.

The spacer layer 11 is preferably in contact with the piezoelectric layer 14. More preferably, the thermal conductivity of the spacer layer 11 is higher than the thermal conductivity of the piezoelectric layer 14. When the acoustic wave is excited, heat is generated in the excitation region C. This heat can be efficiently conducted from the piezoelectric layer 14 to the support substrate 16 side by the spacer layer 11. Therefore, heat dissipation can be enhanced.

As illustrated in FIG. 1, the wiring 17 and the spacer layer 11 preferably overlap each other in a plan view. In this case, even when an unnecessary bulk wave is generated in the wiring 17 or another wiring, the transmission of the unnecessary bulk wave is easily inhibited by the spacer layer 11. Therefore, it is possible to reduce or prevent the reaching of unnecessary bulk waves to the wiring 17 or another wiring, and it is possible to reduce or prevent the ripples in the frequency characteristics.

As illustrated in FIG. 2, it is preferable that at least one of the first busbar 26 and the second busbar 27 overlap the spacer layer 11 in a plan view. As a result, it is possible to reduce or prevent the reaching of unnecessary bulk waves to the first busbar 26, the second busbar 27, or other wiring, and to reduce or prevent the ripples in the frequency characteristics.

In the present preferred embodiment, the spacer layer 11 has a frame shape. No uneven portion is provided on each surface of the spacer layer 11. However, the shape of the spacer layer 11 is not limited to that described above. Further, each surface of the spacer layer 11 may be provided with an uneven portion. First to fifth modifications of the first preferred embodiment, which are different from the first preferred embodiment only in the shape or the number of spacer layers, will be described below. Also in the first to fifth modification, similar to the first preferred embodiment, it is possible to reduce or prevent the variation in the thickness of the piezoelectric layer and to reduce or prevent the deterioration of the frequency characteristics.

Figure 8:
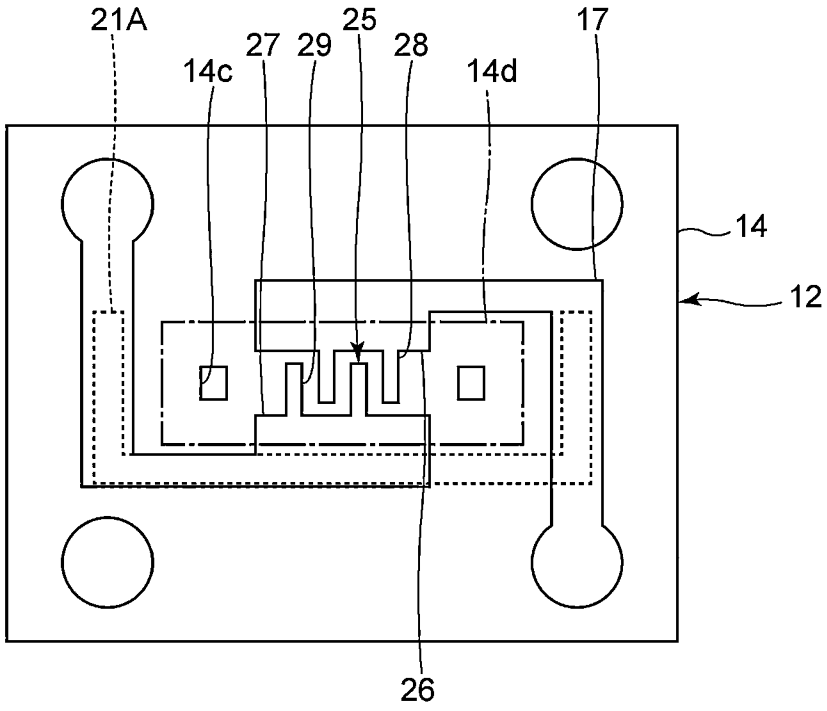
FIG. 8 is a plan view of an acoustic wave device according to a first modification of the first preferred embodiment of the present invention.

In the first modification example illustrated in FIG. 8, a spacer layer 21A has a U shape in a plan view. The spacer layer 21A surrounds the membrane portion 14*d* of the piezoelectric layer 14 in three directions.

Figure 9:
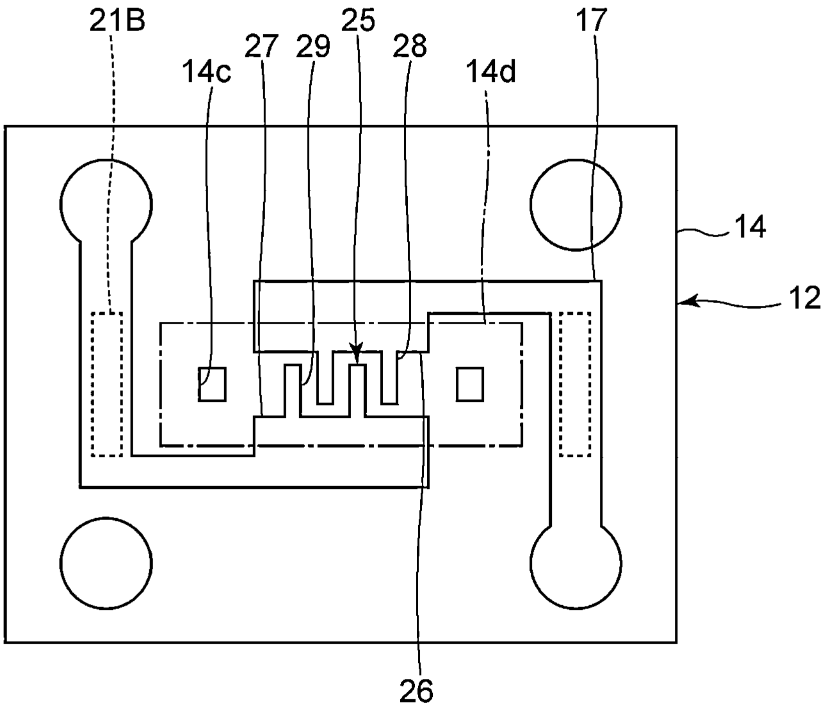
FIG. 9 is a plan view of an acoustic wave device according to a second modification of the first preferred embodiment of the present invention.

In the second modification illustrated in FIG. 9, a pair of spacer layers 21B are provided. Each of the pair of spacer layers 21B has a rectangular or substantially rectangular shape extending in the electrode finger extending direction in a plan view. The pair of spacer layers 21B face each other across the membrane portion 14*d* in a plan view. All portions of the pair of spacer layers 21B overlap the wiring 17 in a plan view. In this manner, the plurality of spacer layers 21B may be provided. Note that the number, shape, and position of the plurality of spacer layers 21B are not particularly limited. For example, the pair of spacer layers 21B may face each other across the membrane portion 14*d* in the electrode finger extending direction.

Figure 10:
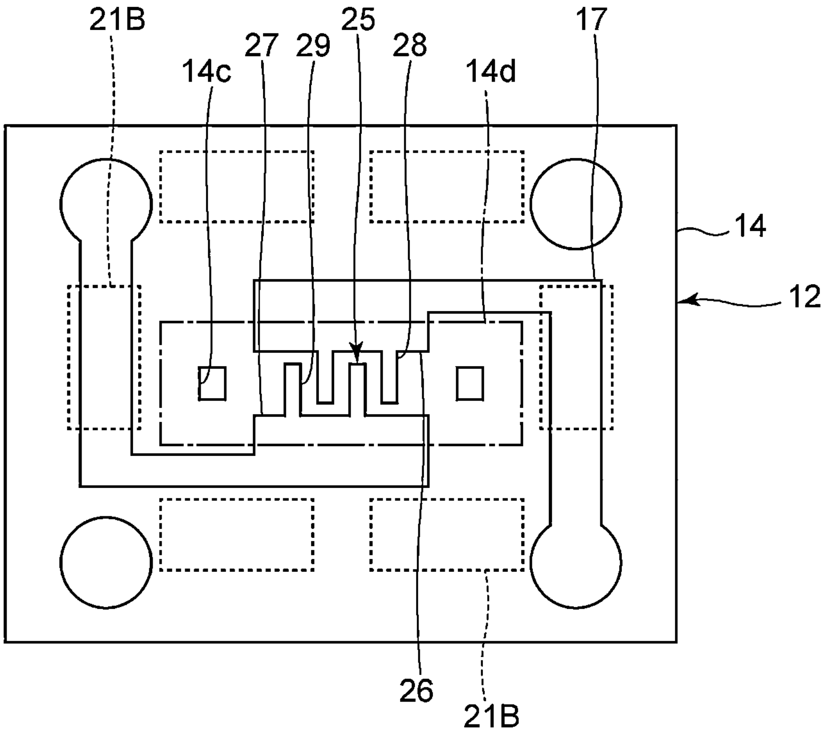
FIG. 10 is a plan view of an acoustic wave device according to a third modification of the first preferred embodiment of the present invention.

In the third modification illustrated in FIG. 10, the plurality of spacer layers 21B is provided. To be more specific, the plurality of spacer layers 21B includes three pairs of spacer layers 21B. In the present modification, the two pairs of spacer layers 21B do not overlap the wiring 17 in a plan view. One pair of spacer layers 21B of the two pairs of spacer layers 21B face each other across the membrane portion 14*d* in the electrode finger extending direction. The same applies to the other pair of spacer layers 21B. Each of the two pairs of spacer layers 21B has a rectangular or substantially rectangular shape extending in the electrode finger facing direction in a plan view.

A pair of spacer layers 21B among the plurality of spacer layers 21B overlap the wiring 17 in a plan view. Note that each of the pair of spacer layers 21B includes a portion that does not overlap the wiring 17 in a plan view. The pair of spacer layers 21B face each other across the membrane portion 14*d* in the electrode finger facing direction. Each of the pair of spacer layers 21B has a rectangular or substantially rectangular shape extending in the electrode finger extending direction in a plan view.

Figure 11:
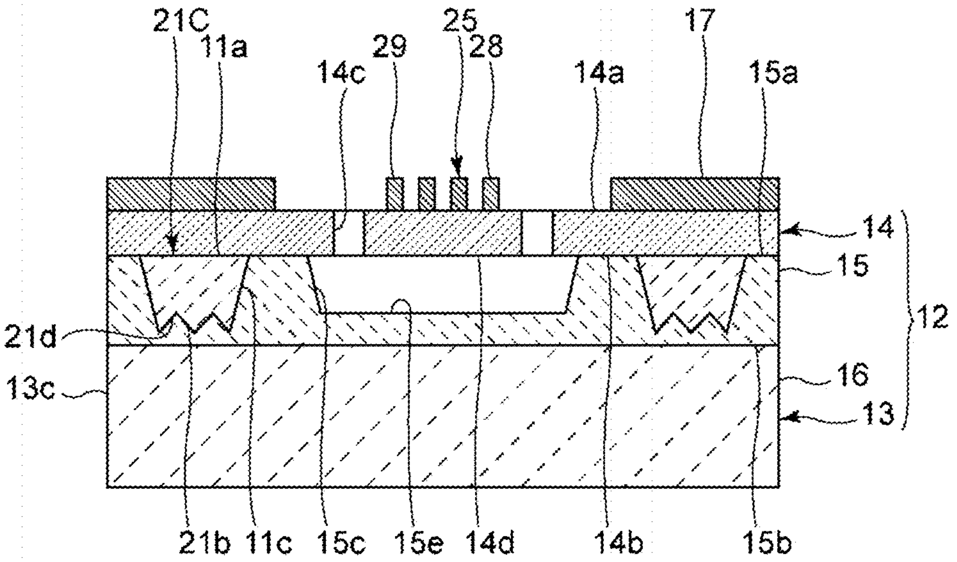
FIG. 11 is a front cross-sectional view of an acoustic wave device according to a fourth modification of the first preferred embodiment of the present invention.

In the fourth modification illustrated in FIG. 11, an uneven portion 21*d* is provided on a second surface 21*b* of a spacer layer 21C. As a result, unnecessary bulk waves can be scattered. Therefore, the ripples in the frequency characteristics can be suppressed. When the uneven portion 21*d* is provided on the second surface 21*b*, for example, after the spacer layer 11 similar to that of the first preferred embodiment is formed, the surface roughening treatment may be performed on the second surface 11*b*. The surface roughening treatment may be performed by, for example, polishing or the like. Thereafter, the intermediate layer 15 may be provided.

Figure 12:
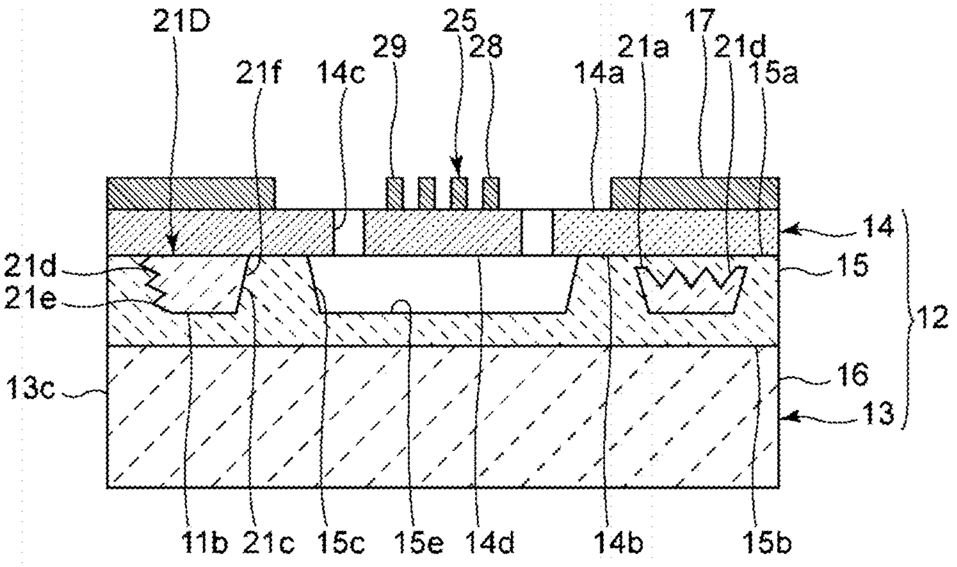
FIG. 12 is a front cross-sectional view of an acoustic wave device according to a fifth modification of the first preferred embodiment of the present invention.

In the fifth modification example illustrated in FIG. 12, the uneven portion 21*d* is provided in a portion of a side surface 21*c* and a portion of a first surface 21*a* of a spacer layer 21D. More specifically, the side surface 21*c* includes a first side surface 21*e* and a second side surface 21*f*. The first side surface 21*e* and the second side surface 21*f* face each other. The first side surface 21*e* is a side surface farther from the membrane portion 14*d*. The second side surface 21*f* is a side surface closer to the membrane portion 14*d*. In the present modification, the uneven portion 21*d* is provided in a portion of the first side surface 21*e*. Note that a portion of the first surface 21*a* in which the uneven portion 21*d* is provided is located in the intermediate layer 15. Therefore, the portion of the first surface 21*a* is not in contact with the piezoelectric layer 14.

Also in the present modification, since the uneven portion 21*d* is provided in the spacer layer 21D as described above, it is possible to scatter unnecessary bulk waves. Therefore, the ripples in the frequency characteristics can be suppressed. When the spacer layer 21D is provided, for example, a portion of the intermediate layer 15 is provided before the spacer layer is provided. The uneven portion may be provided in a portion of the intermediate layer 15, and then the spacer layer may be provided. Next, the surface roughening treatment may be performed on the side surface of the spacer layer. The surface roughening treatment may be performed by, for example, polishing or the like. Thus, the spacer layer 21D can be obtained. Thereafter, the remaining portion of the intermediate layer 15 may be provided.

In the present modification, the uneven portion 21*d* is provided in a portion of the first side surface 21*e* of the spacer layer 21D. Note that the uneven portion 21*d* may be provided on the entire first side surface 21*e*. The same applies to the first surface 21*a*. Furthermore, the uneven portion 21*d* may be provided in at least a portion of the second side surface 21*f*. However, it is not necessary that the uneven portion 21*d* is provided on both the side surface 21*c* and the first surface 21*a* of the spacer layer 21D. That is, the uneven portion 21*d* may be provided on at least a portion of at least one surface of the first side surface 21*e*, the second side surface 21*f*, and the first surface 21*a* of the spacer layer 21D.

Figure 13:
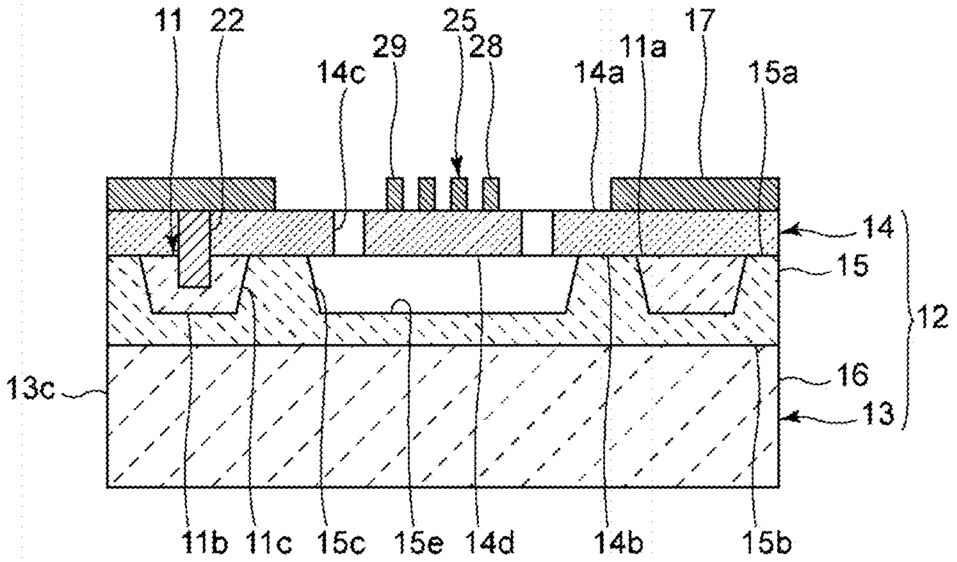
FIG. 13 is a front cross-sectional view of an acoustic wave device according to a sixth modification of the first preferred embodiment of the present invention.

As illustrated in FIG. 2, in the present preferred embodiment, the spacer layer 11 is surrounded by the piezoelectric layer 14 and the intermediate layer 15. However, the spacer layer 11 may be in contact with a member other than the piezoelectric layer 14 and the intermediate layer 15. For example, in the sixth modification of the first preferred embodiment illustrated in FIG. 13, the spacer layer 11 is connected to one end of a via electrode 22. More specifically, the via electrode 22 penetrates the piezoelectric layer 14. The other end of the via electrode 22 is connected to the wiring 17. Thus, the number of heat dissipation paths can be increased. Therefore, heat dissipation can be enhanced. In addition, also in this modification, similar to the first preferred embodiment, it is possible to reduce or prevent the variation in the thickness of the piezoelectric layer 14 and to reduce or prevent the deterioration of the frequency characteristics.

In the present modification, one end of the via electrode 22 is located in the spacer layer 11. However, one end of the via electrode 22 may be in contact with the surface of the spacer layer 11.

As described above, the spacer layer 11 may be made of metal. In this case, the wiring 17 and the spacer layer 11 are electrically connected by the via electrode 22 in the present modification.

As illustrated in FIG. 1, the support member 13 includes a main surface on the piezoelectric layer 14 side, a main surface facing the main surface, and a side surface 13*c*. The side surface 13*c* is connected to both main surfaces of the support member 13. The side surface 13*c* is defined by side surfaces of the intermediate layer 15 and the support substrate 16. A sealing resin layer may be provided so as to cover the side surface 13*c* of the support member 13, the piezoelectric layer 14, and the like. An example of this is illustrated below.

Figure 14:
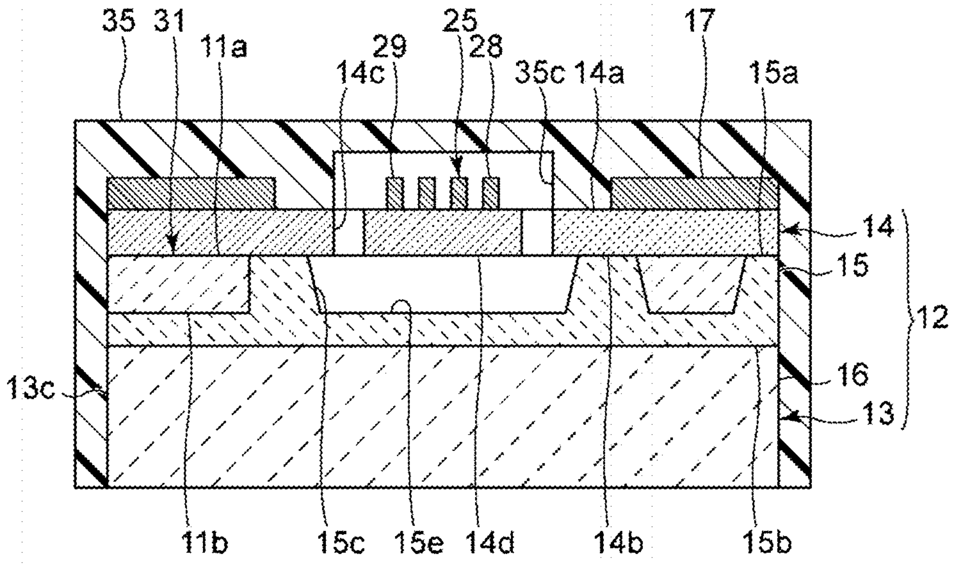
FIG. 14 is a front cross-sectional view of an acoustic wave device according to a second preferred embodiment of the present invention.

FIG. 14 is a front cross-sectional view of an acoustic wave device according to a second preferred embodiment.

The present preferred embodiment is different from the first preferred embodiment in that a sealing resin layer 35 is provided and a spacer layer 31 is in contact with the sealing resin layer 35. Except for the above-described points, the acoustic wave device of the present preferred embodiment has the same configuration as that of the acoustic wave device 10 of the first preferred embodiment.

The sealing resin layer 35 is provided so as to cover the side surface 13*c* of the support member 13, the piezoelectric layer 14, the wiring 17, and the IDT electrode 25. More specifically, a recess 35*c* is provided on the piezoelectric layer 14 side of the sealing resin layer 35. The recess 35*c* overlaps the membrane portion 14*d* in a plan view. In the present preferred embodiment, the sealing resin layer 35 is not in contact with at least a portion of the membrane portion 14*d* and the IDT electrodes 25. Thus, the excitation of the acoustic wave is unlikely to be inhibited. Furthermore, breakage of the acoustic wave device can be reduced or prevented by the sealing resin layer 35.

The spacer layer 31 is exposed from the side surface 13*c* of the support member 13. More specifically, the spacer layer 31 is exposed from the side surface of the intermediate layer 15. In the present preferred embodiment, the portion of the spacer layer 31 exposed from the support member 13 is flush with the side surface of the support member 13. The portion of the spacer layer 31 exposed from the support member 13 and a portion of the spacer layer 31 facing the exposed portion extend in parallel or substantially parallel to the laminating direction. However, the portion of the spacer layer 31 facing the portion exposed from the support member 13 may be inclined with respect to the laminating direction.

The portion of the spacer layer 31 exposed from the support member 13 is in contact with the sealing resin layer 35. Thus, the spacer layer 31 can efficiently conduct heat not only to the support substrate 16 side but also to the sealing resin layer 35 side. Therefore, heat dissipation can be enhanced. In addition, also in the present preferred embodiment, similar to the first preferred embodiment, it is possible to reduce or prevent variation in the thickness of the piezoelectric layer 14 and to reduce or prevent deterioration of the frequency characteristics.

Note that the sealing resin layer 35 may be provided in preferred embodiments other than the second preferred embodiment and each modification.

Figure 15:
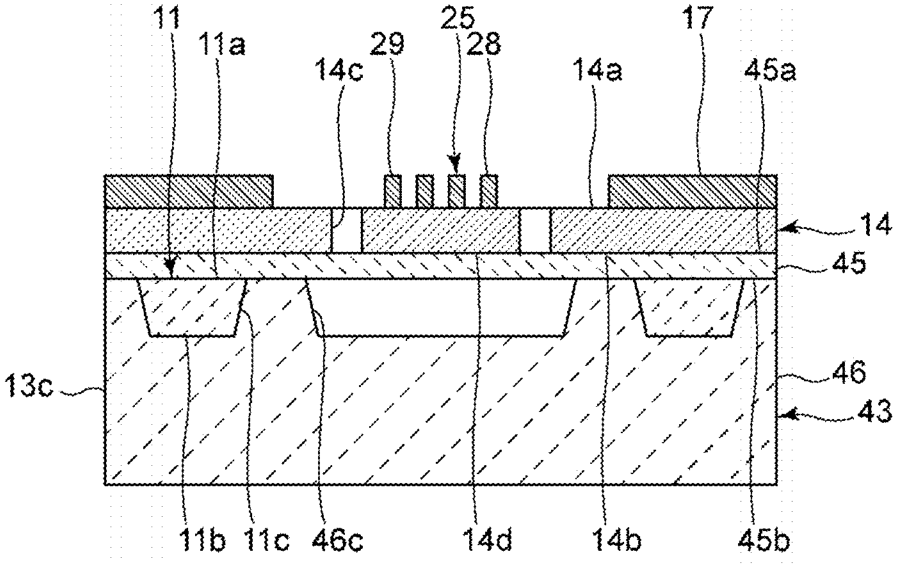
FIG. 15 is a front cross-sectional view of an acoustic wave device according to a third preferred embodiment of the present invention.

FIG. 15 is a front cross-sectional view of an acoustic wave device according to a third preferred embodiment.

The present preferred embodiment is different from the first preferred embodiment in that the spacer layer 11 is provided in a support substrate 46 and a recess 46*c* is provided in the support substrate 46. The recess 46*c* is closed by an intermediate layer 45. The intermediate layer 45 is located between the spacer layer 11 and the piezoelectric layer 14. Except for the above-described points, the acoustic wave device of the present preferred embodiment has the same configuration as that of the acoustic wave device 10 of the first preferred embodiment.

Also in the present preferred embodiment, it is possible to reduce or prevent the variation in the thickness of the piezoelectric layer 14 and to reduce or prevent the deterioration of the frequency characteristics. This will be described in detail below together with an example of a method for manufacturing an acoustic wave device of the present preferred embodiment.

FIGS. 16A to 16D are front cross-sectional views for describing an example of the method for manufacturing the acoustic wave device according to the third preferred embodiment.

Figure 16A:
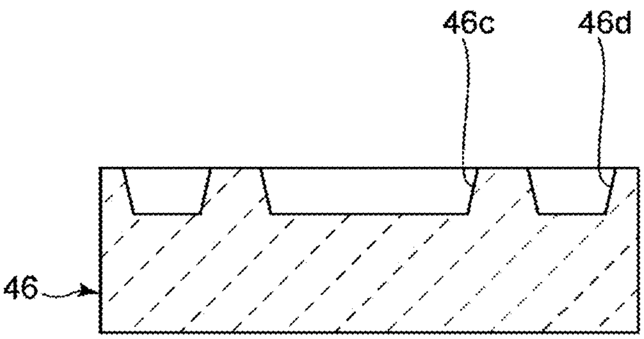
FIGS. 16A to 16D are front cross-sectional views for describing an example of a method for manufacturing the acoustic wave device according to the third preferred embodiment of the present invention.

As illustrated in FIG. 16A, the recess 46*c* and a recess 46*d* are provided in the support substrate 46. Note that the recess 46*d* has a frame shape in a plan view. Each recess can be formed by, for example, an RIE method. When the RIE method is used, a resist pattern may be appropriately formed by a photolithography method or the like in a portion other than a portion where each recess is provided on the support substrate 46. Thereafter, the resist pattern may be removed.

Figure 16B:
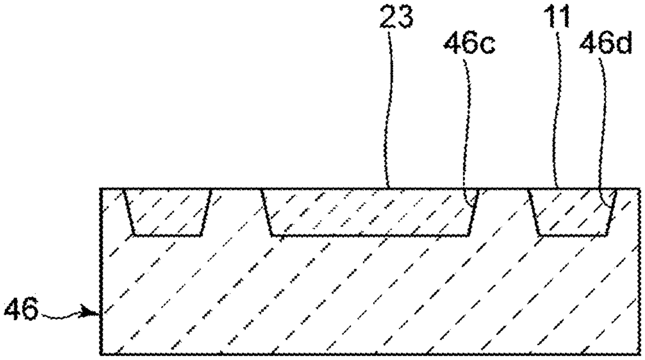

Next, as illustrated in FIG. 16B, the sacrificial layer 23 is provided in the recess 46*c*. To be more specific, the sacrificial layer 23 is provided so as to fill the inside of the recess 46*c*. Next, the spacer layer 11 is provided in the recess 46*d*. To be more specific, the spacer layer 11 is provided so as to fill the inside of the recess 46*d*. Note that the sacrificial layer 23 may be provided after the spacer layer 11 is provided. Alternatively, when the sacrificial layer 23 and the spacer layer 11 are made of the same material, the sacrificial layer 23 and the spacer layer 11 may be provided at the same time. Next, the sacrificial layer 23 and the spacer layer 11 are flattened.

Figure 16C:
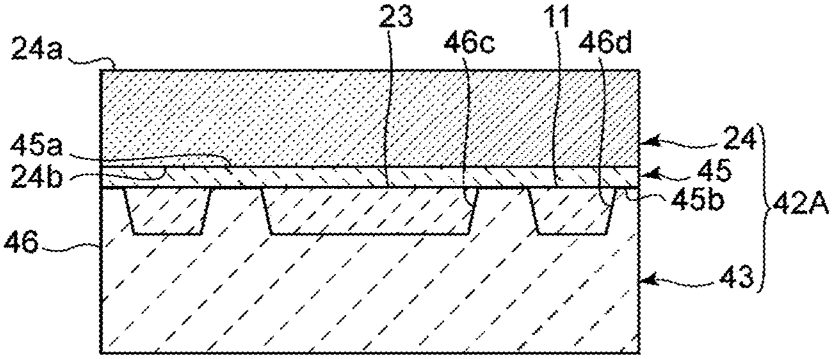

Next, as illustrated in FIG. 16C, the intermediate layer 45 is provided on the support substrate 46 so as to cover the sacrificial layer 23 and the spacer layer 11. Next, the intermediate layer 45 is flattened. Next, the piezoelectric substrate 24 is bonded to the intermediate layer 45.

Figure 16D:
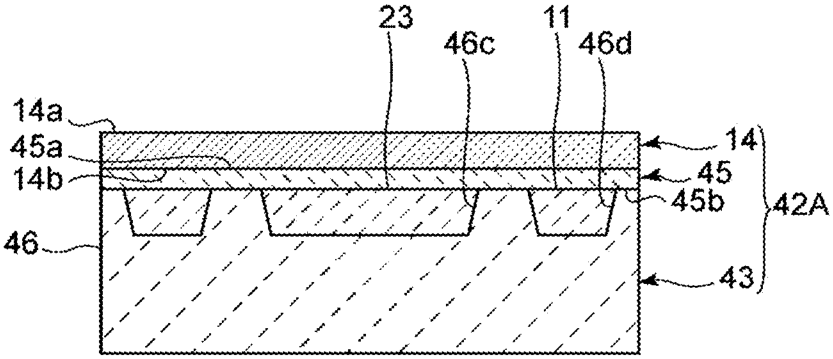

Next, as illustrated in FIG. 16D, the piezoelectric layer 14 is obtained by adjusting the thickness of the piezoelectric substrate 24 in the same manner as in the example of the method for manufacturing an acoustic wave device 10 according to the first preferred embodiment described above. Thus, a laminated body 42A of a support member 43 and the piezoelectric layer 14 is obtained. The subsequent processes can be performed in the same manner as in the example of the method for manufacturing the acoustic wave device 1 according to the first preferred embodiment described above.

As illustrated in FIG. 16C, the surfaces of the sacrificial layer 23, the spacer layer 11, and the support substrate 46 on the intermediate layer 45 side are flush with one other. Thus, the intermediate layer 45 can be uniformly flattened. Therefore, undulation is unlikely to occur on a third main surface 45*a* of the intermediate layer 45. In this manner, the piezoelectric substrate 24 is ground or polished in a state in which the undulation on the third main surface 45*a* side is suppressed. Therefore, as illustrated in FIG. 16D, it is possible to reduce or prevent variation in the thickness of the piezoelectric layer 14. Therefore, it is possible to reduce or prevent unnecessary bulk waves caused by the variation in the thickness of the piezoelectric layer 14, and it is possible to reduce or prevent deterioration of frequency characteristics.

Note that although there may be a case where the surfaces of the sacrificial layer 23, the spacer layer 11, and the support substrate 46 on the intermediate layer 45 side are not be completely flush with each other, at least the positions of the sacrificial layer 23 and the spacer layer 11 on the intermediate layer 45 side in the laminating direction can be easily made the same. Thus, the intermediate layer 45 can be uniformly flattened.

Note that in the present preferred embodiment as well, an uneven portion may be provided on each surface of the spacer layer 11 as in each modification of the first preferred embodiment. In this case, for example, the uneven portion may be formed in the second surface 11*b* or the side surface 11*c* of the spacer layer 11 by providing the uneven portion in the recess 46*d* of the support substrate 46. Alternatively, for example, after the spacer layer 11 is provided in the recess 46*d*, the uneven portion may be formed on the first surface 11*a*.

In the first to third preferred embodiments and the respective modifications, the acoustic wave device is a single acoustic wave resonator. Note that an acoustic wave device according to a preferred embodiment of the present invention may include a plurality of acoustic wave resonators. An example of this is illustrated below.

Figure 17:
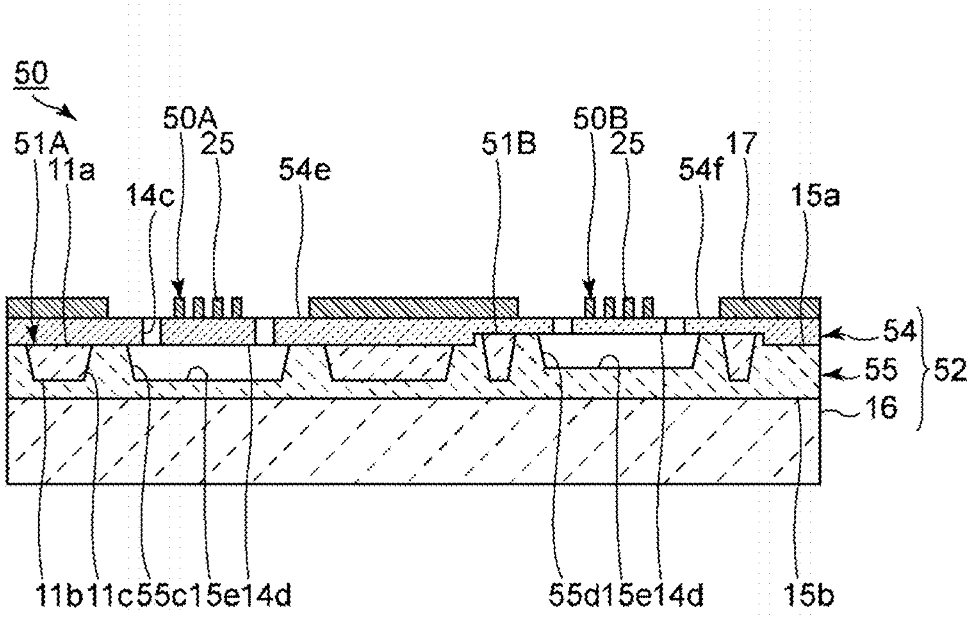
FIG. 17 is a front cross-sectional view of an acoustic wave device according to a fourth preferred embodiment of the present invention.

FIG. 17 is a front cross-sectional view of an acoustic wave device according to a fourth preferred embodiment.

An acoustic wave device 50 includes an acoustic wave resonator 50A and an acoustic wave resonator 50B. The acoustic wave resonators 50A and 50B share a piezoelectric substrate 52. The piezoelectric substrate 52 is a laminated substrate of the support substrate 16, an intermediate layer 55, and a piezoelectric layer 54. The piezoelectric layer 54 includes a first portion 54*e* and a second portion 54*f*. The thickness of the first portion 54*e* and the thickness of the second portion 54*f* are different from each other. To be more specific, in the present preferred embodiment, the first portion 54*e* is thicker than the second portion 54*f*. Note that the number of portions having different thicknesses in the piezoelectric layer 54 is not limited to two. For example, the piezoelectric layer 54 may include three or more portions having different thicknesses.

The intermediate layer 55 is provided with a plurality of recesses. Each recess is closed by the piezoelectric layer 54. To be more specific, in the present preferred embodiment, the plurality of recesses includes a first recess 55*c* and a second recess 55*d*. The first recess 55*c* overlaps the first portion 54*e* of the piezoelectric layer 54 in a plan view. The second recess 55*d* overlaps the second portion 54*f* in a plan view. The positions of the bottom surface 15*e* of the first recess 55*c* and the second recess 55*d* in the laminating direction are different from each other. To be more specific, in the present preferred embodiment, the bottom surface 15*e* of the first recess 55*c* is located closer to the support substrate 16 side than the bottom surface 15*e* of the second recess 55*d*. Note that the number of recesses is not limited to two. The intermediate layer 55 may include three or more recesses.

The plurality of recesses of the intermediate layer 55 is closed by the piezoelectric layer 54. Thus, a plurality of cavity portions is provided. The piezoelectric layer 54 includes the plurality of membrane portions 14*d*. In a plan view, each of the membrane portions 14*d* overlaps each cavity portion.

The IDT electrode 25 as an excitation electrode is provided on each of the membrane portions 14*d*. However, the plurality of IDT electrodes 25 may be provided in one membrane portion 14*d*. The number of IDT electrodes 25 is not particularly limited.

In the present preferred embodiment, a plurality of spacer layers is provided in the intermediate layer 55. More particularly, the plurality of spacer layers is a first spacer layer 51A and a second spacer layer 51B. The first spacer layer 51A overlaps the first portion 54*e* of the piezoelectric layer 54 in a plan view. The second spacer layer 51B overlaps the second portion 54*f* in a plan view. Each of the spacer layers is arranged in a portion other than the cavity portion. As described above, since the plurality of spacer layers is provided in the intermediate layer 55, it is possible to reduce or prevent variation in the thickness of the first portion 54*e* and variation in the thickness of the second portion 54*f* of the piezoelectric layer 54. Therefore, it is possible to reduce or prevent unnecessary bulk waves caused by the variation in the thickness of each portion of the piezoelectric layer 54, and it is possible to reduce or prevent deterioration of frequency characteristics.

Among the bottom surfaces 15*e* of the plurality of recesses in the intermediate layer 55, the bottom surface 15*e* closest to the support substrate 16 is preferably located at the same position in the laminating direction as the second surface lib of the first spacer layer 51A and the second surface lib of the second spacer layer 51B. In the present preferred embodiment, the thicknesses of the piezoelectric layer 54 are different in the first portion 54*e* and the second portion 54*f*. Even in such a case, the above-described configuration allows the surface of the sacrificial layer closest to the support substrate 16 and the second surface lib of each spacer layer to be located at the same position in the laminating direction in a manufacturing process. As a result, the intermediate layer 55 can be more reliably and uniformly flattened. Accordingly, undulation is less likely to occur on the fourth main surface 15*b* side of the intermediate layer 55. Also, undulation of the third main surface 15*a* caused by the undulation of the fourth main surface 15*b* is less likely to occur.

Therefore, it is possible to more reliably reduce or prevent the variation in the thickness of each of the first portion 54*e* and the second portion 54*f* of the piezoelectric layer 54. Therefore, it is possible to more reliably reduce or prevent unnecessary bulk waves caused by the variation in the thickness of each portion of the piezoelectric layer 54, and it is possible to more reliably reduce or prevent the deterioration of the frequency characteristics.

Note that the second surface lib of the first spacer layer 51A and the second surface lib of the second spacer layer 51B need not be located at the same position in the laminating direction. In this case, the bottom surface 15*e* of the second recess 55*d* and the second surface lib of the second spacer layer 51B are preferably located at the same position in the laminating direction. However, the bottom surfaces 15*e* of the first recess 55*c* and the second recess 55*d* and the second surfaces 11*b* of the first spacer layer 51A and the second spacer layer 51B may be located at the same position in the laminating direction. In this case, it is possible to more reliably reduce or prevent the variation in the thickness of each of the first portion 54*e* and the second portion 54*f* of the piezoelectric layer 54. Therefore, it is possible to more reliably reduce or prevent the deterioration of the frequency characteristic.

In preferred embodiments of the present invention, an excitation electrode is not limited to the IDT electrode. Hereinafter, an example in which the acoustic wave device is a bulk acoustic wave (BAW) element will be described.

Figure 18:
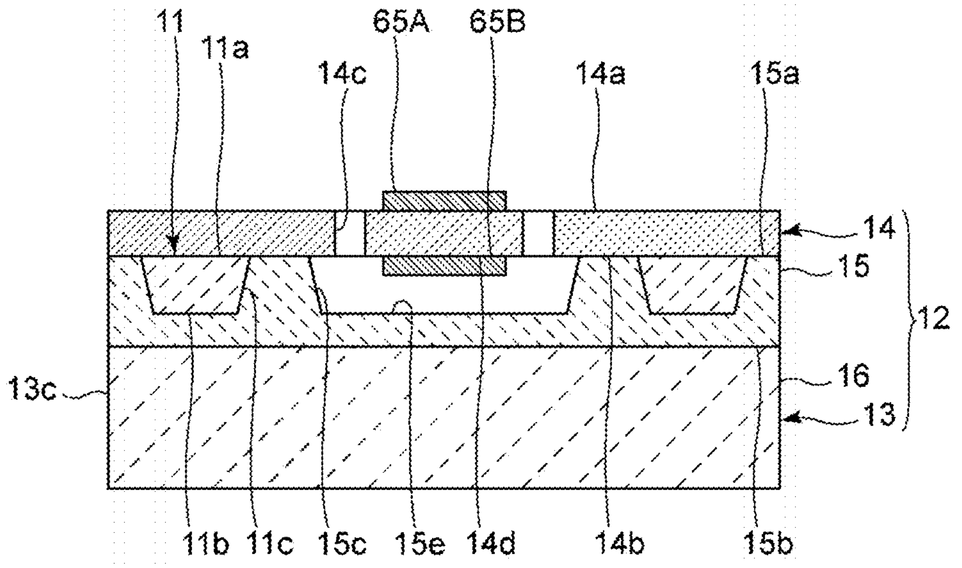
FIG. 18 is a front cross-sectional view of an acoustic wave device according to a fifth preferred embodiment of the present invention.

FIG. 18 is a front cross-sectional view of an acoustic wave device according to a fifth preferred embodiment.

The present preferred embodiment is different from the first preferred embodiment in that an excitation electrode includes an upper electrode 65A and a lower electrode 65B. The upper electrode 65A is provided on the first main surface 14*a* of the piezoelectric layer 14. The lower electrode 65B is provided on the second main surface 14*b*. Except for the above-described points, the acoustic wave device of the present preferred embodiment has the same configuration as that of the acoustic wave device 10 of the first preferred embodiment.

The upper electrode 65A and the lower electrode 65B face each other across the piezoelectric layer 14. A portion where the upper electrode 65A, the lower electrode 65B, and the piezoelectric layer 14 overlap one other in a plan view is an excitation portion. Bulk waves are excited in the excitation portion. Note that the cavity portion in the support member 13 overlaps at least a portion of the upper electrode 65A and the lower electrode 65B in a plan view. More specifically, the cavity portion overlaps the excitation portion in a plan view.

Also in the present preferred embodiment, the spacer layer 11 is provided as in the first preferred embodiment. As a result, variation in the thickness of the piezoelectric layer 14 can be reduced or prevented, and deterioration of frequency characteristics can be reduced or prevented.

Hereinafter, an acoustic wave device that uses bulk waves in a thickness-shear mode will be described in detail using an acoustic wave device that does not have a spacer layer as an example. Note that the support member described below corresponds to the support substrate in each of the above-described preferred embodiments and modifications. An insulating layer described below corresponds to the intermediate layer in each of the preferred embodiments and modifications described above.

Figure 19A:
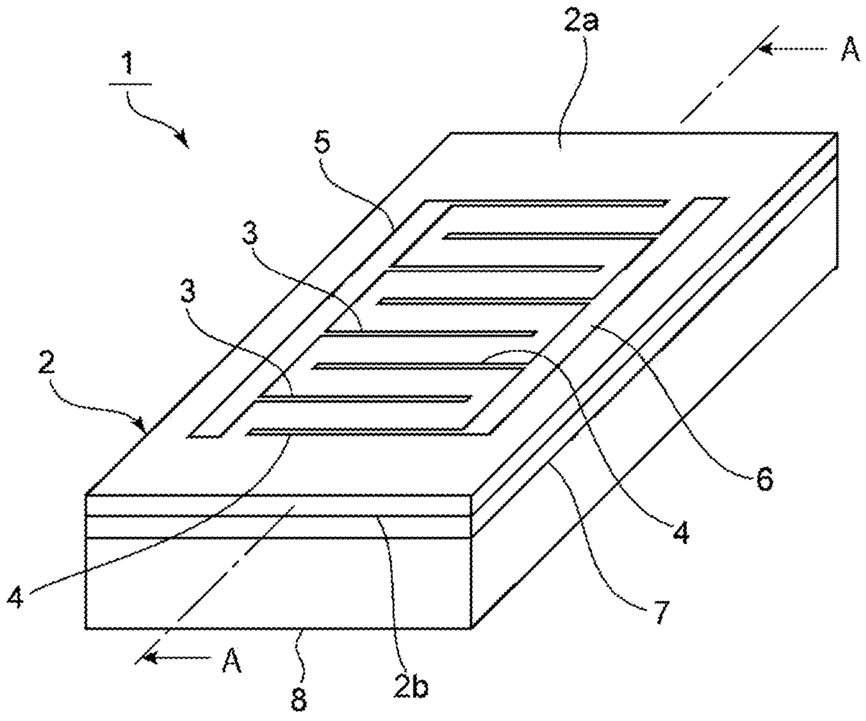
FIG. 19A is a schematic perspective view illustrating appearance of the filter device using bulk waves in a thickness-shear mode.
Figure 19B:
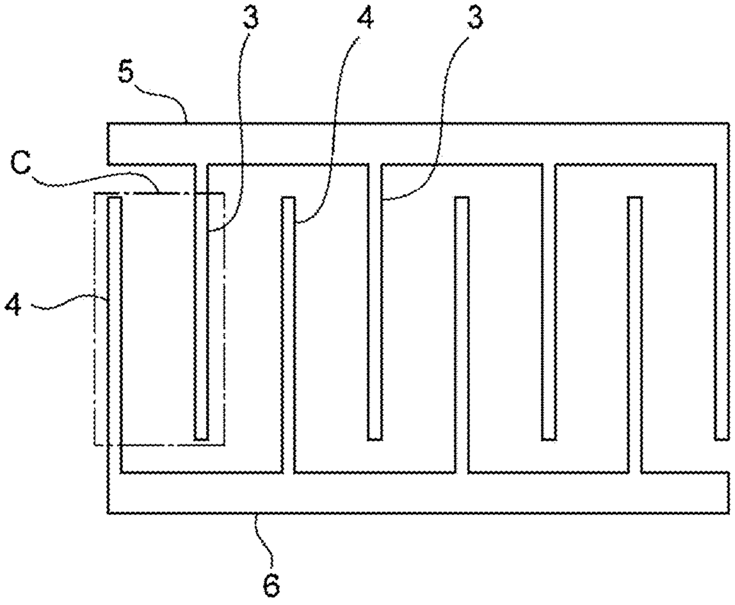
FIG. 19B is a plan view illustrating an electrode structure on a piezoelectric layer.
Figure 20:
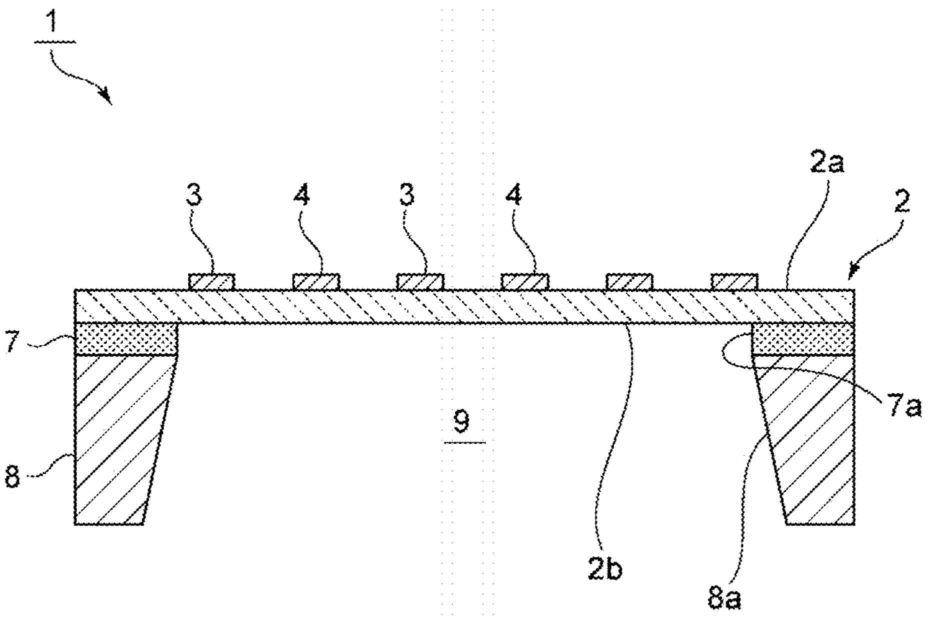
FIG. 20 is a cross-sectional view of a portion taken along a line A-A in FIG. 19A.

FIG. 19A is a schematic perspective view illustrating an appearance of an acoustic wave device using bulk waves in the thickness-shear mode, FIG. 19B is a plan view illustrating an electrode structure on a piezoelectric layer, and FIG. 20 is a cross-sectional view of a portion taken along a line A-A in FIG. 19A.

The acoustic wave device 1 has the piezoelectric layer 2 made of $LiNbO_3$. The piezoelectric layer 2 may be made of $LiTaO_3$. The cut angle of $LiNbO_3$ and $LiTaO_3$ is Z-cut, but may be rotated Y-cut or X-cut. In order to effectively excite the thickness-shear mode, the thickness of the piezoelectric layer 2 is, but is not particularly limited, preferably equal to or more than about 40 nm and equal to or less than about 1000 nm, and more preferably equal to or more than about 50 nm and equal to or less than about 1000 nm, for example. The piezoelectric layer 2 includes first and second main surfaces 2*a* and 2*b* facing each other. An electrode 3 and an electrode 4 are provided on the first main surface 2*a*. Here, the electrode 3 is an example of the "first electrode", and the electrode 4 is an example of the "second electrode". In FIGS. 19A and 19B, the plurality of electrodes 3 is connected to a first busbar 5. The plurality of electrodes 4 is connected to a second busbar 6. The plurality of electrodes 3 and the plurality of electrodes 4 are interdigitated with each other. The electrode 3 and the electrode 4 have a rectangular or substantially rectangular shape and have a length direction. The electrode 3 and the adjacent electrode 4 face each other in a direction perpendicular or substantially perpendicular to the length direction. The plurality of electrodes 3 and 4, the first busbar 5, and the second busbar 6 define an IDT electrode. The length direction of the electrodes 3 and 4 and the direction perpendicular or substantially perpendicular to the length direction of the electrodes 3 and 4 are both directions intersecting a thickness direction of the piezoelectric layer 2. Therefore, it can also be said that the electrode 3 and the adjacent electrode 4 face each other in the direction intersecting the thickness direction of the piezoelectric layer 2. Further, the length direction of the electrodes 3 and 4 may be replaced with the direction perpendicular or substantially perpendicular to the length direction of the electrodes 3 and 4 illustrated in FIGS. 19A and 19B. That is, in FIGS. 19A and 19B, the electrodes 3 and 4 may extend in a direction in which the first busbar 5 and the second busbar 6 extend. In this case, the first busbar 5 and the second busbar 6 extend in a direction in which the electrodes 3 and 4 extend in FIGS. 19A and 19B. A plurality of pairs of structures in which the electrode 3 connected to one potential and the electrode 4 connected to the other potential are adjacent to each other is provided in a direction perpendicular or substantially perpendicular to the length direction of the above electrodes 3 and 4. Here, the electrode 3 and the electrode 4 being adjacent to each other refers not to a case where the electrode 3 and the electrode 4 are arranged so as to be in direct contact with each other but to a case where the electrode 3 and the electrode 4 are arranged with an interval therebetween. In addition, when the electrode 3 and the electrode 4 are adjacent to each other, an electrode connected to a hot electrode or a ground electrode, including the other electrodes 3 and 4, is not arranged between the electrode 3 and the electrode 4. The number of pairs needs not be integer pairs, but may be 1.5 pairs, 2.5 pairs, and the like. A center-to-center distance between the electrodes 3 and 4, that is, a pitch is preferably in the range of equal to or more than about 1 μm and equal to or less than about 10 μm, for example. In addition, the width of the electrodes 3 and 4, that is, the dimension of the electrodes 3 and 4 in a facing direction is preferably in a range of equal to or more than about 50 nm and equal to or less than about 1000 nm, and more preferably in a range of equal to or more than about 150 nm and equal to or less than about 1000 nm, for example. Note that the center-to-center distance between the electrodes 3 and 4 is the distance between the center of the dimension (width dimension) of the electrode 3 in the direction perpendicular or substantially perpendicular to the length direction of the electrode 3 and the center of the dimension (width dimension) of the electrode 4 in the direction perpendicular or substantially perpendicular to the length direction of the electrode 4.

In addition, since the acoustic wave device 1 uses a Z-cut piezoelectric layer, the direction perpendicular or substantially perpendicular to the length direction of the electrodes 3 and 4 is perpendicular or substantially perpendicular to the polarization direction of the piezoelectric layer 2. This does not apply when a piezoelectric body having another cut angle is used as the piezoelectric layer 2. Here, "perpendicular or substantially perpendicular to" is not limited to be strictly perpendicular or substantially perpendicular to but may be substantially perpendicular or substantially perpendicular to (an angle formed by a direction perpendicular or substantially perpendicular to the length direction of the electrodes 3 and 4 and the polarization direction is within a range of about 90°±10°, for example).

A support member 8 is laminated on the second main surface 2*b* side of the piezoelectric layer 2 via an insulating layer 7. The insulating layer 7 and the support member 8 have a frame shape, and have through-holes 7*a* and 8*a* as illustrated in FIG. 20. Thus, a cavity portion 9 is formed. The cavity portion 9 is provided so as not to interfere with the vibration of the excitation region C of the piezoelectric layer 2. Therefore, the above support member 8 is laminated on the second main surface 2*b* via the insulating layer 7 at a position not overlapping a portion where at least the pair of electrodes 3 and 4 are provided. Note that the insulating layer 7 need not be provided. Therefore, the support member 8 can be directly or indirectly laminated on the second main surface 2*b* of the piezoelectric layer 2.

The insulating layer 7 is made of silicon oxide. However, in addition to silicon oxide, an appropriate insulating material such as silicon oxynitride, alumina or the like may be used. The support member 8 is made of Si. The plane orientation of the surface of Si on the piezoelectric layer 2 side may be (100), (110), or (111). It is desirable that Si forming the support member 8 have a high resistance with resistivity of equal to or higher than about 4 kΩ, for example. However, the support member 8 can also be formed using an appropriate insulating material or semiconductor material.

As the material for the support member 8, for example, piezoelectric bodies such as aluminum oxide, lithium tantalate, lithium niobate, quartz crystal and the like; various ceramics such as alumina, magnesia, sapphire, silicon nitride, aluminum nitride, silicon carbide, zirconia, cordierite, mullite, steatite, forsterite and the like; dielectrics such as diamond, glass and the like; and semiconductors such as gallium nitride can be used.

The plurality of electrodes 3 and 4 and the first and second busbars 5 and 6 described above are made of an appropriate metal or alloy such as Al, an AlCu alloy or the like. In the present preferred embodiment, the electrodes 3 and 4 and the first and second busbars 5 and 6 have a structure in which an Al film is laminated on a Ti film. Note that a close contact layer other than the Ti film may be used.

At the time of driving, an AC voltage is applied between the plurality of electrodes 3 and the plurality of electrodes 4. More specifically, the AC voltage is applied between the first busbar 5 and the second busbar 6. As such, it is possible to obtain resonance characteristics using bulk waves in the thickness-shear mode excited in the piezoelectric layer 2. In addition, in the acoustic wave device 1, when the thickness of the piezoelectric layer 2 is defined as d and the center-to-center distance between any adjacent electrodes 3 and 4 of the plurality of pairs of electrodes 3 and 4 is defined as p, d/p is considered to be equal to or less than about 0.5, for example. Therefore, the bulk waves in the above thickness-shear mode are effectively excited, and good resonance characteristics can be obtained. More preferably, d/p is equal to or less than about 0.24, for example, in which case even better resonance characteristics can be obtained.

Since the acoustic wave device 1 has the above-described configuration, even when the number of pairs of the electrodes 3 and 4 is reduced in order to achieve a reduction in size, a Q value is less likely to decrease. This is because propagation loss is small even when the number of electrode fingers in the reflectors on both sides is reduced. In addition, the number of electrode fingers above can be reduced because bulk waves in the thickness-shear mode are used. The difference between the Lamb waves used in the acoustic wave device and the bulk waves in the above thickness-shear mode will be described with reference to FIGS. 21A and 21B.

Figure 21A:
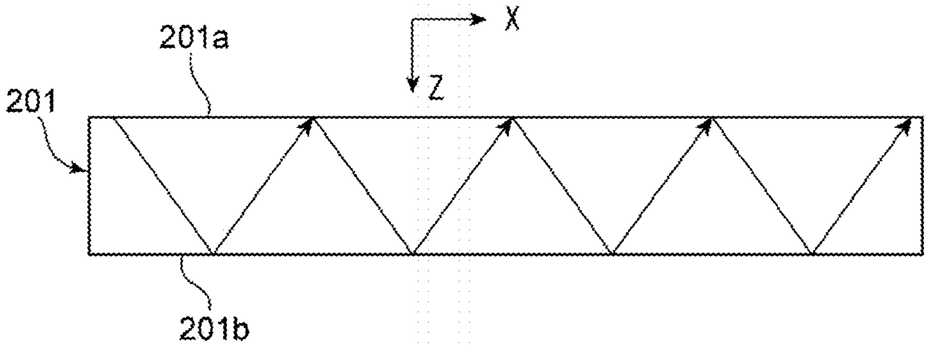
FIG. 21A is a schematic front cross-sectional view for explaining Lamb waves propagating through a piezoelectric film of the acoustic wave device.

FIG. 21A is a schematic front cross-sectional view for explaining Lamb waves propagating through the piezoelectric film of the acoustic wave device as described in Japanese Unexamined Patent Application Publication No. 2012-257019. Here, waves propagate through a piezoelectric film 201 as indicated by arrows. Here, in the piezoelectric film 201, a first main surface 201*a* and a second main surface 201*b* face each other, and the thickness direction connecting the first main surface 201*a* and the second main surface 201*b* is a Z-direction. An X-direction is a direction in which the electrode fingers of the IDT electrode are arranged. As illustrated in FIG. 21A, the wave of Lamb waves propagates in the X-direction. Although the piezoelectric film 201 vibrates as a whole because of the plate wave, since the wave propagates in the X-direction, reflectors are arranged on both sides to obtain resonance characteristics. Therefore, the propagation loss of waves occurs, and the Q value decreases when the size is reduced, that is, when the number of pairs of electrode fingers is reduced.

Figure 21B:
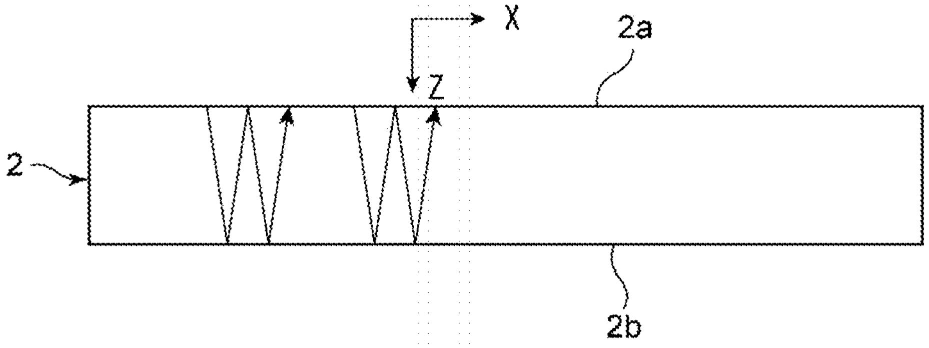
FIG. 21B is a schematic front cross-sectional view for explaining bulk waves in the thickness-shear mode propagating through the piezoelectric film in the filter device.

On the other hand, as illustrated in FIG. 21B, in the acoustic wave device 1, since the vibration displacement is in a thickness-shear direction, the wave propagates substantially in the direction connecting the first main surface 2*a* and the second main surface 2*b* of the piezoelectric layer 2, that is, in the Z-direction, and resonates. That is, the X-direction component of the wave is significantly smaller than the Z-direction component. Since resonance characteristics are obtained by the propagation of the wave in the Z-direction, the propagation loss is less likely to occur even when the number of electrode fingers of the reflector is reduced. Furthermore, even when the number of electrode pairs composed of electrodes 3 and 4 is reduced in order to reduce the size, the Q value is less likely to decrease.

Figure 22:
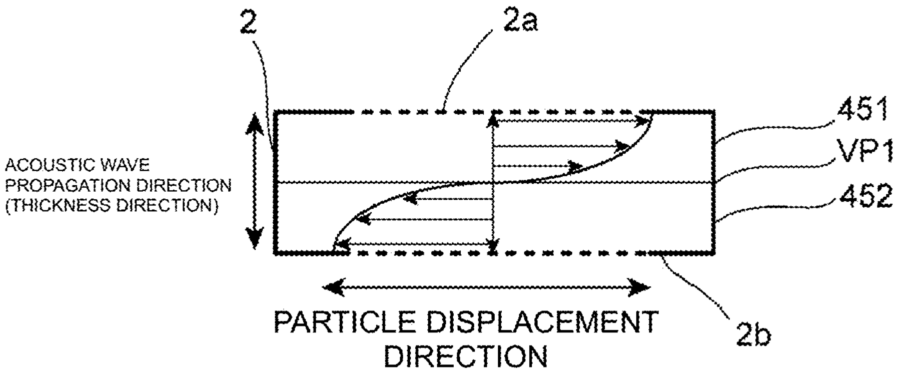
FIG. 22 is a diagram illustrating an amplitude direction of bulk waves in the thickness-shear mode.

Note that as illustrated in FIG. 22, amplitude directions of the bulk waves in the thickness-shear mode are opposite in a first region 451 included in the excitation region C of the piezoelectric layer 2 and a second region 452 included in the excitation region C. FIG. 22 schematically illustrates bulk waves when a voltage is applied between the electrode 3 and the electrode 4 so that the electrode 4 has a higher potential than the electrode 3. The first region 451 is a region of the excitation region C between the first main surface 2*a* and a virtual plane VP1 that is perpendicular or substantially perpendicular to the thickness direction of the piezoelectric layer 2 and divides the piezoelectric layer 2 into two parts. The second region 452 is a region of the excitation region C between the virtual plane VP1 and the second main surface 2*b*.

As described above, in the acoustic wave device 1, at least one pair of electrodes composed of the electrode 3 and the electrode 4 is arranged, however, since waves are not propagated in the X-direction, the number of pairs of electrodes composed of the electrodes 3 and 4 does not need to be plural. That is, at least one pair of electrodes may be provided.

For example, the above electrode 3 is an electrode connected to the hot potential, and the electrode 4 is an electrode connected to the ground potential. However, the electrode 3 may be connected to the ground potential and the electrode 4 may be connected to the hot potential. In the present preferred embodiment, as described above, at least one pair of electrodes is an electrode connected to the hot potential or an electrode connected to the ground potential, and a floating electrode is not provided.

Figure 23:
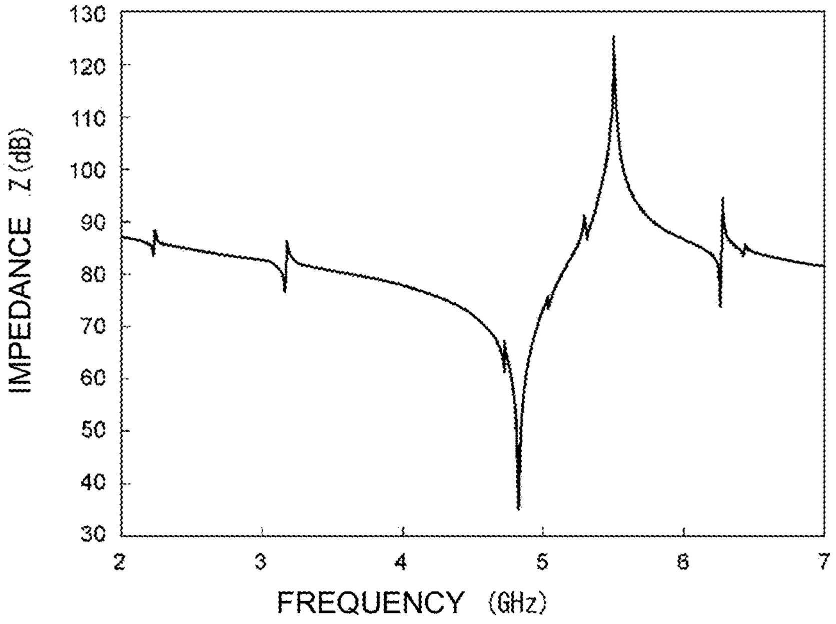
FIG. 23 is a diagram illustrating resonance characteristics of the filter device using bulk waves in the thickness-shear mode.

FIG. 23 is a diagram illustrating resonance characteristics of the acoustic wave device illustrated in FIG. 20. Note that the design parameters of the acoustic wave device 1 having this resonance characteristics are as follows.

Piezoelectric layer 2: $LiNbO_3$ with Euler angles (0°, 0°, 90°), thickness=about 400 nm.

When viewed in a direction perpendicular or substantially perpendicular to the length direction of the electrodes 3 and 4, a region where the electrodes 3 and 4 overlap, that is, the excitation region C=about 40 μm, the number of pairs of electrodes composed of electrodes 3 and 4=21 pairs, the distance between the centers of the electrodes=about 3 μm, the width of the electrodes 3 and 4=about 500 nm, d/p=about 0.133.

Insulating layer 7: silicon oxide film with thickness of about 1 μm.

Support member 8: Si.

Note that the length of the excitation region C is a dimension of the excitation region C along the length direction of the electrodes 3 and 4.

In the present preferred embodiment, the electrode distances of the electrode pairs including the electrodes 3 and 4 were all made equal in a plurality of pairs. That is, the electrodes 3 and the electrodes 4 were arranged at equal or substantially equal pitches.

As is clear from FIG. 23, good resonance characteristics with a fractional bandwidth of about 12.5% is obtained even though no reflector is provided.

When the thickness of the above piezoelectric layer 2 is defined as d and the center-to-center distance between the electrodes 3 and 4 is defined as p, d/p is equal to or less than about 0.5 and more preferably equal to or less than about 0.24, for example, in the present preferred embodiment as described above. This will be described with reference to FIG. 24.

Figure 24:
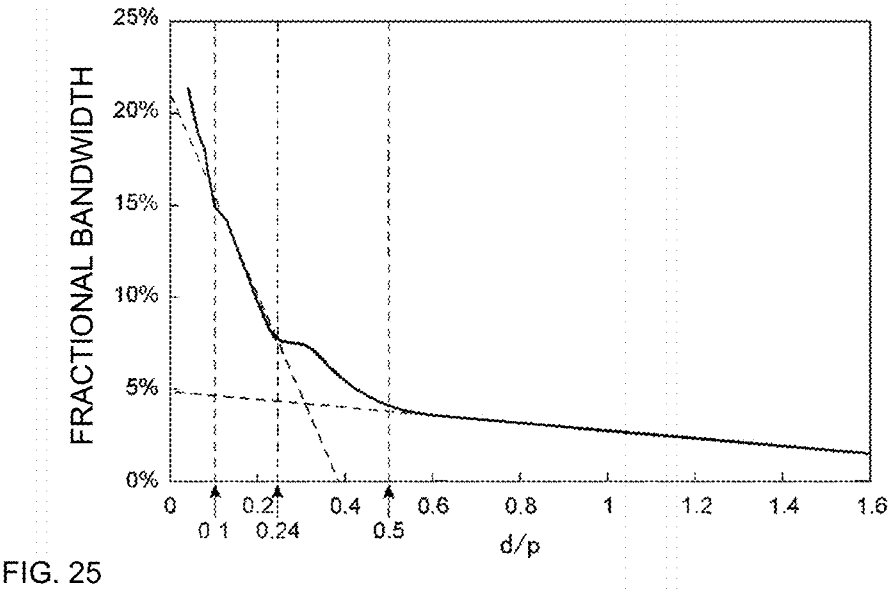
FIG. 24 is a diagram illustrating a relationship between d/p and the fractional bandwidth as a resonator, when p is a center-to-center distance between adjacent electrodes and d is the thickness of the piezoelectric layer.

A plurality of acoustic wave devices was obtained in the same manner as the acoustic wave device having the resonance characteristics illustrated in FIG. 23 except that d/p was changed. FIG. 24 is a diagram illustrating a relationship between d/p and a fractional bandwidth as a resonator of the acoustic wave device.

As is clear from FIG. 24, when d/p>about 0.5, the fractional bandwidth is less than 5% even when d/p is adjusted. On the other hand, in the case of d/p≤about 0.5, by changing d/p within the range, the fractional bandwidth can be set to equal to or more than about 5%, that is, a resonator having a high coupling coefficient can be formed. Further, when d/p is equal to or less than about 0.24, the fractional bandwidth can be increased to equal to or more than about 7%. In addition, when d/p is adjusted within this range, a resonator having a wider fractional bandwidth can be obtained, and a resonator having a higher coupling coefficient can be achieved. Therefore, it is understood that by setting d/p to equal to or less than about 0.5, a resonator having a high coupling coefficient using the bulk waves in the above thickness-shear mode can be formed.

Figure 25:
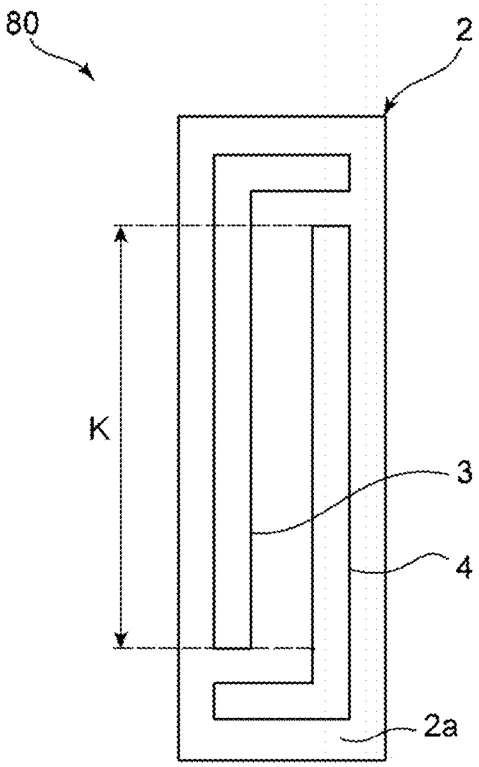
FIG. 25 is a plan view of the acoustic wave device using bulk waves in the thickness-shear mode.

FIG. 25 is a plan view of an acoustic wave device using bulk waves in the thickness-shear mode. In an acoustic wave device 80, a pair of electrodes having the electrodes 3 and 4 are provided on the first main surface 2*a* of the piezoelectric layer 2. Note that K in FIG. 25 is an overlap width. As described above, in an acoustic wave device according to a preferred embodiment of the present invention, the number of pairs of electrodes may be one. Also in this case, when d/p above is equal to or less than about 0.5, the bulk waves in the thickness-shear mode can be effectively excited.

Figure 26:
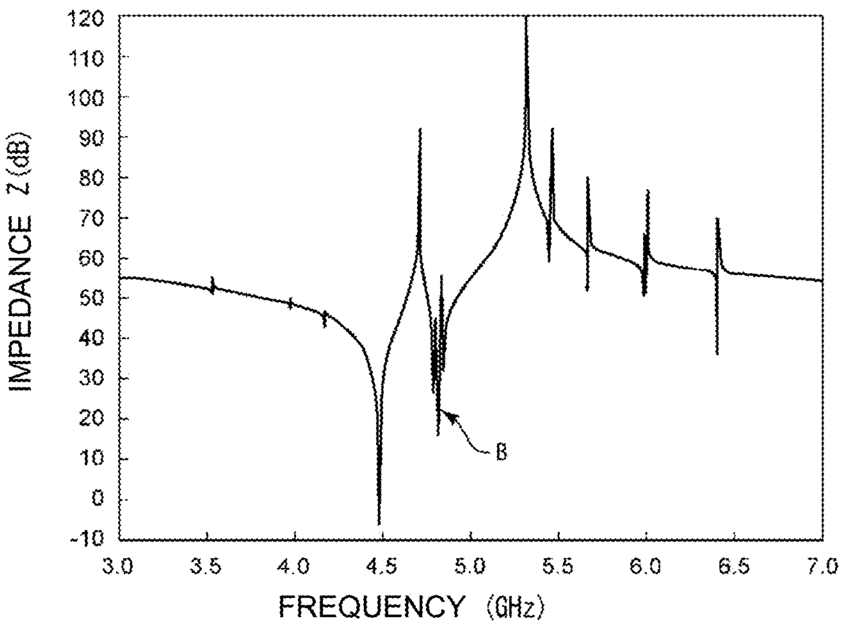
FIG. 26 is a diagram illustrating resonance characteristics of an acoustic wave device of a reference example in which a spurious emission appears.

In the acoustic wave device 1, when viewed in a direction in which any adjacent electrodes 3 and 4 of the plurality of electrodes 3 and 4 face each other, it is preferable that a metallization ratio MR of the above adjacent electrodes 3 and 4 with respect to the excitation region C, which is the overlapping region, satisfy MR≤about 1.75 (d/p)+0.075. In this case, a spurious emission can be effectively reduced. This will be described with reference to FIG. 26 and FIG. 27. FIG. 26 is a reference diagram illustrating an example of resonance characteristics of the above acoustic wave device 1. A spurious emission indicated by an arrow B appears between the resonant frequency and the anti-resonant frequency. Note that d/p=about 0.08 and $LiNbO_3$ with Euler angles (0°, 0°, 90°) were set. In addition, the above metallization ratio MR was set to MR=about 0.35.

The metallization ratio MR will be described with reference to FIG. 19B. When attention is paid to the pair of electrodes 3 and 4 in the electrode structure of FIG. 19B, it is assumed that only the pair of electrodes 3 and 4 is provided. In this case, a portion surrounded by an alternate long and short dash line is the excitation region C. The excitation region C is, when the electrode 3 and the electrode 4 are viewed in a direction perpendicular or substantially perpendicular to the length direction of the electrodes 3 and 4, that is, in the facing direction, a region where the electrode 3 overlaps the electrode 4, a region where the electrode 4 overlaps the electrode 3, and a region where the electrode 3 and the electrode 4 overlap each other in a region between the electrode 3 and the electrode 4. The area of the electrodes 3 and 4 in the excitation region C with respect to the area of the excitation region C is the metallization ratio MR. That is, the metallization ratio MR is the ratio of the area of the metallization portion with respect to the area of the excitation region C.

Note that when a plurality of pairs of electrodes is provided, the rate of the metallization portion included in the entire excitation region with respect to the sum of the areas of the excitation regions may be defined as MR.

Figure 27:
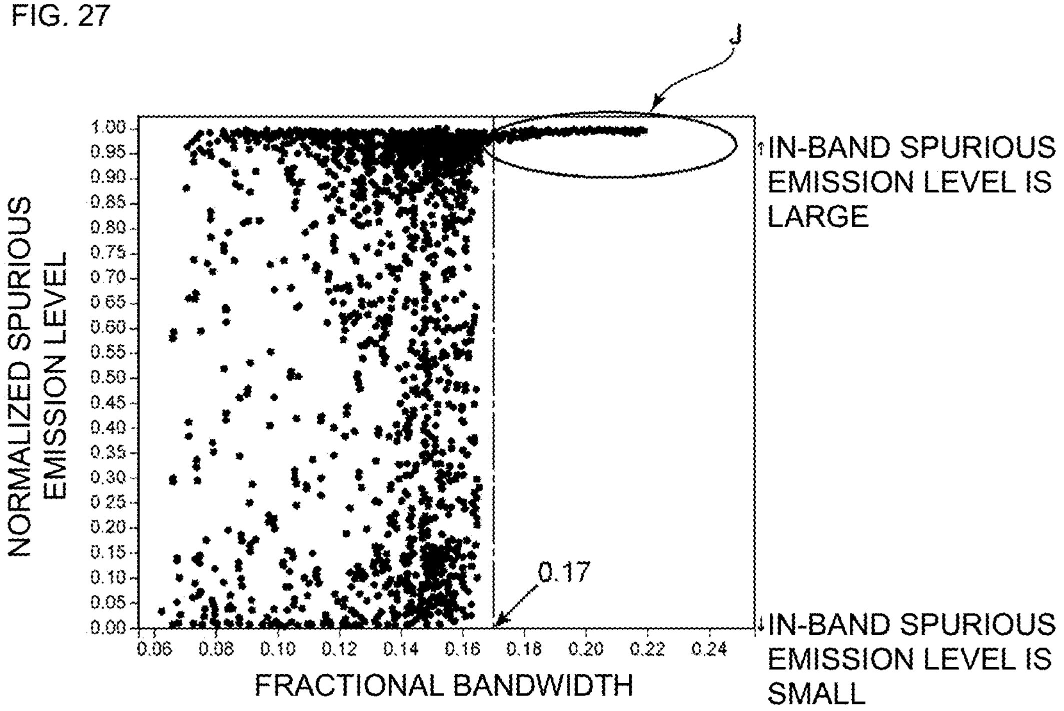
FIG. 27 is a diagram illustrating a relationship between the fractional bandwidth and a phase rotation amount of spurious impedance normalized by 180 degrees as the magnitude of the spurious emission.

FIG. 27 is a diagram illustrating the relationship between the fractional bandwidth and the phase rotation amount of the spurious impedance normalized by 180 degrees as the magnitude of the spurious emission when a large number of acoustic wave resonators are configured according to the present preferred embodiment. Note that the fractional bandwidth was adjusted by variously changing the film thickness of the piezoelectric layer and the dimension of the electrodes. In addition, although FIG. 27 illustrates the results in the case of using the piezoelectric layer formed of the Z-cut $LiNbO_3$, the same tendency is obtained also in the case of using the piezoelectric layer having another cut angle.

In a region surrounded by an ellipse J in FIG. 27, a spurious emission level is as large as about 1.0. As is clear from FIG. 27, when the fractional bandwidth exceeds about 0.17, that is, when the fractional bandwidth exceeds about 17%, a large spurious emission having the spurious emission level of equal to or more than 1 appears in the pass band even when the parameters constituting the fractional bandwidth are changed. That is, as in the resonance characteristics illustrated in FIG. 26, the large spurious emission indicated by an arrow B appears in the band. Therefore, the fractional bandwidth is preferably equal to or less than about 17%. In this case, the spurious emission can be reduced by adjusting the film thickness of the piezoelectric layer 2, the dimension of the electrodes 3 and 4, and the like.

Figure 28:
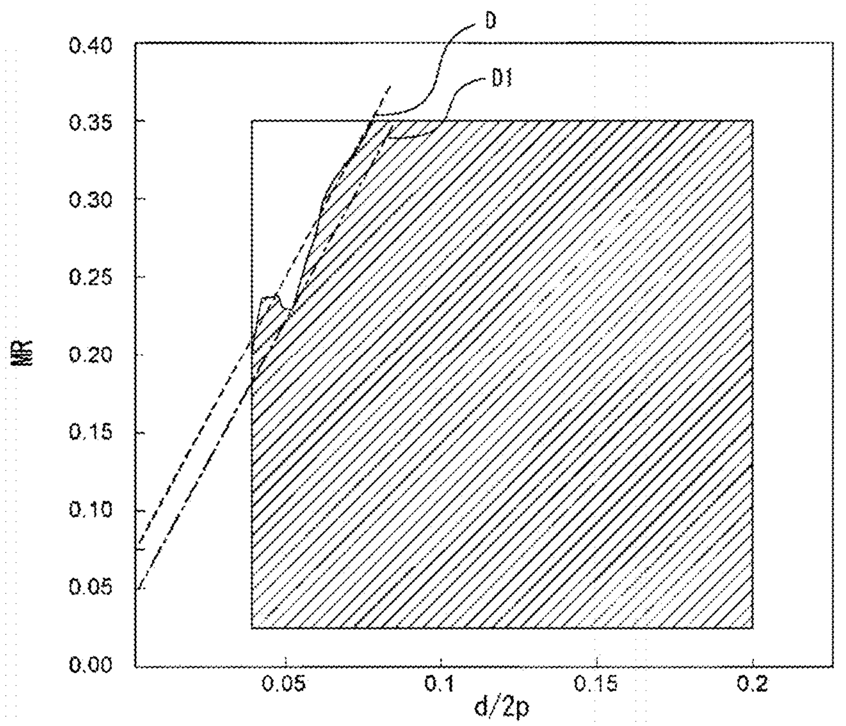
FIG. 28 is a graph illustrating a relationship between d/2p and a metallization ratio MR.

FIG. 28 illustrates a relationship among d/2p, the metallization ratio MR, and the fractional bandwidth. In the above acoustic wave device, various acoustic wave devices having different d/2p and different MRs were formed, and the fractional bandwidth was measured. A hatched portion on the right side of a broken line D in FIG. 28 is a region where the fractional bandwidth is equal to or less than about 17%. The boundary between the hatched region and the non-hatched region is represented by MR=about 3.5 (d/2p)+0.075. That is, MR=about 1.75 (d/p)+0.075. Therefore, preferably MR≤about 1.75 (d/p)+0.075 is satisfied. In this case, the fractional bandwidth is likely to be equal to or less than about 17%. More preferably, it is the region on the right side of MR=about 3.5 (d/2p)+0.05 indicated by an alternate long and short dash line D1 in FIG. 28. That is, when MR≤about 1.75 (d/p)+0.05, the fractional bandwidth can be reliably set to equal to or less than about 17%.

Figure 29:
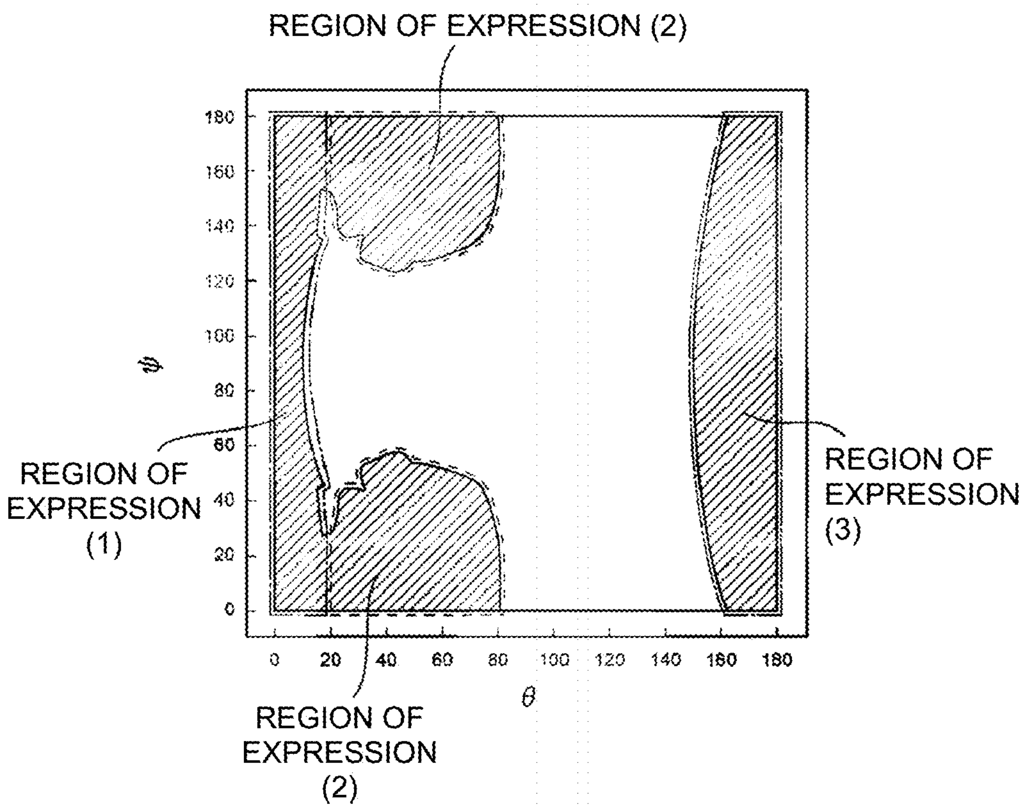
FIG. 29 is a diagram illustrating a map of the fractional bandwidth with respect to the Euler angles (0°, θ, ψ) of $LiNbO_3$ when d/p is made as close to 0 as possible.

FIG. 29 is a diagram illustrating a map of the fractional bandwidth with respect to the Euler angles (0°, θ, ψ) of $LiNbO_3$ when d/p is brought close to 0 as much as possible. A hatched portion in FIG. 29 is a region in which a fractional bandwidth of at least equal to or more than about 5% is obtained, and when the range of the region is approximated, the range is represented by the following Expression (1), Expression (2), and Expression (3).

$$(0° \pm 10°, 0° \text{ to } 20°, \text{arbitrary } \psi) \quad \text{Expression (1)}$$

$$(0° \pm 10°, 20° \text{ to } 80°, 0° \text{ to } 60° (1-(\theta-50)^2/900)^{1/2}) \text{ or } (0° \pm 10°, 20° \text{ to } 80°, [180° - 60° (1-(\theta-50)^2/900)^{1/2}] \text{ to } 180°) \quad \text{Expression (2)}$$

-continued $$(0° \pm 10°, [180° - 30° (1-(\psi-90)^2/8100)^{1/2}] \text{ to } 180°, \text{arbitrary } \psi) \quad \text{Expression (3)}$$

Therefore, in the case of the Euler angle range of the above Expression (1), Expression (2) or Expression (3), the fractional bandwidth can be sufficiently widened, which is preferable. The same applies to the case where the piezoelectric layer 2 is a lithium tantalate layer.

Figure 30:
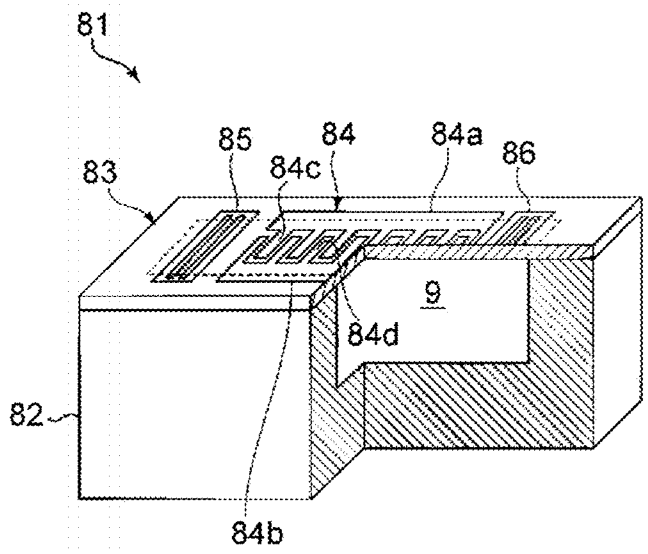
FIG. 30 is a partially cutaway perspective view for explaining an acoustic wave device using Lamb waves.

FIG. 30 is a partially cutaway perspective view for explaining an acoustic wave device using plate waves.

An acoustic wave device 81 has a support substrate 82. The support substrate 82 is provided with a recess that is open to an upper surface. A piezoelectric layer 83 is laminated on the support substrate 82. Thus, the cavity portion 9 is formed. An IDT electrode 84 is provided on the piezoelectric layer 83 above the cavity portion 9. Reflectors 85 and 86 are provided on both sides of the IDT electrode 84 in an acoustic wave propagation direction. In FIG. 30, the outer peripheral edge of the cavity portion 9 is indicated by a broken line. Here, the IDT electrode 84 includes first and second busbars 84*a* and 84*b*, a plurality of first electrode fingers 84*c*, and a plurality of second electrode fingers 84*d*. The plurality of first electrode fingers 84*c* is connected to the first busbar 84*a*. The plurality of second electrode fingers 84*d* is connected to the second busbar 84*b*. The plurality of first electrode fingers 84*c* and the plurality of second electrode fingers 84*d* are interdigitated with each other.

In the acoustic wave device 81, Lamb waves as plate waves are excited by applying an alternating electric field to the IDT electrode 84 on the above cavity portion 9. Since the reflectors 85 and 86 are provided on both sides, resonance characteristics due to the above Lamb waves can be obtained.

As described above, an acoustic wave device according to a preferred embodiment of the present invention may use plate waves. In this case, the IDT electrode 84 and the reflectors 85 and 86 illustrated in FIG. 30 may be provided on the piezoelectric layer in each of the first to fourth preferred embodiments and the modifications.

In the piezoelectric substrate in the acoustic wave device of the first to fourth preferred embodiments and each of the modification using the bulk waves in the thickness-shear mode, d/p is preferably equal to or less than about 0.5 and more preferably equal to or less than about 0.24 as described above. As a result, even better resonance characteristics can be obtained. Furthermore, in the acoustic wave device of the first preferred embodiment and each of the modifications using the bulk waves in the thickness-shear mode, MR≤about 1.75 (d/p)+0.075 is preferably satisfied as described above. In this case, the spurious emission can be more reliably suppressed.

It is preferable that the piezoelectric layer in the acoustic wave device of the first to fourth preferred embodiments and each of the modifications using the bulk waves in the thickness-shear mode be made of lithium niobate or lithium tantalate. Preferably, the Euler angles (φ, θ, ψ) of lithium niobate or lithium tantalate constituting the piezoelectric layer are in the range of the above Expression (1), (2) or (3). In this case, the fractional bandwidth can be sufficiently widened.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support including a support substrate and an intermediate layer on the support substrate;
a piezoelectric layer on the intermediate layer; and
an excitation electrode on the piezoelectric layer; wherein
a cavity portion is provided in the support;
the piezoelectric layer includes a membrane portion overlapping the cavity portion in a plan view, the membrane portion including at least a portion of the excitation electrode;
a spacer layer is in the support and made of a material different from materials of the piezoelectric layer and the intermediate layer; and
the spacer layer is located in a portion other than the cavity portion.

2. The acoustic wave device according to claim 1, wherein the spacer layer is in contact with the piezoelectric layer.

3. The acoustic wave device according to claim 1, wherein a thermal conductivity of the spacer layer is higher than a thermal conductivity of the piezoelectric layer.

4. The acoustic wave device according to claim 1, wherein
the spacer layer includes a first surface and a second surface facing each other in a laminating direction of the support, of the first surface and the second surface, the first surface being a surface on the piezoelectric layer side; and
an uneven portion is provided on the second surface.

5. The acoustic wave device according to claim 1, further comprising a wiring provided on the piezoelectric layer and electrically connected to the excitation electrode; wherein
the wiring and the spacer layer overlap each other in a plan view.

6. The acoustic wave device according to claim 1, wherein the spacer layer is provided in the intermediate layer.

7. The acoustic wave device according to claim 6, further comprising a plurality of acoustic wave resonators including:
a plurality of excitation electrodes provided on the piezoelectric layer; and
a plurality of spacer layers provided in the intermediate layer; wherein
the intermediate layer is provided with a plurality of cavity portions each including a bottom surface;
the piezoelectric layer includes a plurality of membrane portions overlapping each of the plurality of cavity portions in a plan view;
each of the plurality of acoustic wave resonators is configured by each of the plurality of excitation electrodes being provided on each of the membrane portions of the piezoelectric layer;
the piezoelectric layer includes a first portion and a second portion having thicknesses different from each other;
each of the plurality of spacer layers includes a first surface and a second surface opposed to each other in a laminating direction of the support, of the first surface and the second surface, the first surface being a surface on a side of the piezoelectric layer;
the plurality of spacer layers includes a first spacer layer overlapping the first portion of the piezoelectric layer and a second spacer layer overlapping the second portion of the piezoelectric layer in a plan view;
the bottom surface of the cavity portion in the first portion of the piezoelectric layer is located at a same position as the second surface of the first spacer layer in the laminating direction of the support; and
at least one of the bottom surface of the cavity portion in the second portion of the piezoelectric layer and the second surface of the first spacer layer is located at a same position as the second surface of the second spacer layer in the laminating direction of the support.

8. The acoustic wave device according to claim 7, wherein the second surface of the first spacer layer is located at a same position as the second surface of the second spacer layer in the laminating direction of the support.

9. The acoustic wave device according to claim 1, wherein
the spacer layer is provided in the support substrate.

10. The acoustic wave device according to claim 1, wherein the excitation electrode is an IDT electrode including a plurality of electrode fingers and is operable to generate plate waves.

11. The acoustic wave device according to claim 1, wherein the excitation electrode is an IDT electrode including a plurality of electrode fingers and is operable to generate bulk waves in a thickness-shear mode.

12. The acoustic wave device according to claim 1, wherein
the excitation electrode is an IDT electrode including a plurality of electrode fingers; and
when a thickness of the piezoelectric layer is defined as d, and a center-to-center distance between adjacent pairs of the electrode fingers is defined as p, d/p about 0.5 is satisfied.

13. The acoustic wave device according to claim 12, wherein when a film thickness of the piezoelectric layer is defined as d and a center-to-center distance between the adjacent pairs of the electrode fingers is defined as p, d/p is equal to or less than about 0.24.

14. The acoustic wave device according to claim 12, wherein a region where the adjacent pairs of the electrode fingers overlap each other when viewed in a direction in which the adjacent pairs of the electrode fingers face each other is an excitation region, and when a metallization ratio of the plurality of electrode fingers with respect to the excitation region is defined as MR, MR≤about 1.75 (d/p)+0.075 is satisfied.

15. The acoustic wave device according to claim 1, wherein
the piezoelectric layer includes a first main surface and a second main surface facing each other, the second main surface of the first main surface and the second main surface being a main surface on the support side;
the excitation electrode includes a set of an upper electrode and a lower electrode, the upper electrode is provided on the first main surface of the piezoelectric layer, and the lower electrode is provided on the second main surface of the piezoelectric layer; and
the upper electrode and the lower electrode face each other.

16. The acoustic wave device according to claim 11, wherein
the piezoelectric layer is made of lithium tantalate or lithium niobate; and Euler angles (φ, θ, ψ) of lithium niobate or lithium niobate of the piezoelectric layer are in a range of one of Expression (1), Expression (2), or Expression (3):

$$(0°\pm 10°, 0° \text{ to } 20°, \text{arbitrary } \psi) \quad \text{Expression (1)}$$

$$(0°\pm 10°, 20° \text{ to } 80°, 0° \text{ to } 60°(1-(\theta-50)^2/900)^{1/2}) \text{ or } \quad \text{Expression (2)}$$

$$(0°\pm 10°, 20° \text{ to } 80°, [180°-60°(1-(\theta-50)^2/900)^{1/2}] \text{ to } 180°)$$

$$(0°\pm 10°, [180°-30°(1-(\psi-90)^2/8100)^{1/2}] \text{ to } 180°, \text{arbitrary } \psi). \quad \text{Expression (3)}$$

17. The acoustic wave device according to claim 1, wherein the piezoelectric layer is made of lithium niobate or lithium tantalate.

18. A method for manufacturing the acoustic wave device according to claim 1, the method comprising:

providing a laminated body that includes the piezoelectric layer and the support including the support substrate and the intermediate layer, a sacrificial layer and the spacer layer being embedded in the support;

providing the excitation electrode on the piezoelectric layer;

providing a through-hole reaching the sacrificial layer in the piezoelectric layer; and providing the cavity portion by removing the sacrificial layer using the through-hole; wherein in the providing the laminated body, the laminated body is provided after the intermediate layer is flattened.

19. The method for manufacturing an acoustic wave device according to claim 18, wherein the sacrificial layer and the spacer layer are made of a same material.

20. The method for manufacturing an acoustic wave device according to claim 18, wherein in the providing the laminated body, the sacrificial layer and the spacer layer are provided on the piezoelectric layer, the intermediate layer is provided on the piezoelectric layer so as to cover the sacrificial layer and the spacer layer, and the support substrate is laminated on the intermediate layer after the intermediate layer is flattened.

21. The method for manufacturing an acoustic wave device according to claim 18, wherein in the providing the laminated body, a plurality of recesses is provided in the support substrate, the sacrificial layer and the spacer layer each are provided in the plurality of recesses, the intermediate layer is provided on the support substrate so as to cover the sacrificial layer and the spacer layer, and the piezoelectric layer is laminated on the intermediate layer after the intermediate layer is flattened.

* * * * *